United States Patent
Kang et al.

(10) Patent No.: US 7,251,174 B2
(45) Date of Patent: *Jul. 31, 2007

(54) SEMICONDUCTOR MEMORY DEVICE FOR LOW POWER SYSTEM

(75) Inventors: Hee-Bok Kang, Kyoungki-do (KR); Jin-Hong Ahn, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 158 days.

This patent is subject to a terminal disclaimer.

(21) Appl. No.: 11/038,861

(22) Filed: Jan. 18, 2005

(65) Prior Publication Data

US 2006/0092738 A1    May 4, 2006

(30) Foreign Application Priority Data

Oct. 30, 2004    (KR) ............... 10-2004-0087658

(51) Int. Cl.
*G11C 7/00* (2006.01)
(52) U.S. Cl. .............. 365/203; 365/207; 365/210
(58) Field of Classification Search ............... 365/203, 365/207, 210
See application file for complete search history.

(56) References Cited

U.S. PATENT DOCUMENTS

| | | |
|---|---|---|
| 5,235,550 A | 8/1993 | Zagar |
| 5,966,315 A | 10/1999 | Muller et al. |
| 6,078,538 A | 6/2000 | Ma et al. |
| 6,381,191 B2 * | 4/2002 | Ooishi ............ 365/230.03 |
| 6,678,199 B1 | 1/2004 | Joo |
| 6,925,022 B2 * | 8/2005 | Arimoto et al. ......... 365/222 |

FOREIGN PATENT DOCUMENTS

| | | |
|---|---|---|
| JP | 6-103754 | 4/1994 |
| JP | 6-187778 | 7/1994 |
| JP | 7-202021 | 8/1995 |
| KR | 1997-003213 | 1/1997 |
| KR | 1998-067036 | 10/1998 |
| KR | 200-0050284 | 8/2000 |

* cited by examiner

*Primary Examiner*—Tuan T. Nguyen
(74) *Attorney, Agent, or Firm*—Blakely Sokoloff Taylor & Zafman

(57) ABSTRACT

A semiconductor memory device for outputting or storing a data in response to inputted address and command includes a first cell array for outputting the data to one of a bit line and a bit line bar; a first reference cell block for outputting a reference signal to the other of the bit line and the bit line bar; a sense amplifying block for sensing and amplifying a voltage difference between the bit line and the bit line bar; and a floating control block for floating the bit line and the bit line bar if a precharge command signal is activated.

31 Claims, 12 Drawing Sheets

SEMICONDUCTOR MEMORY DEVICE FOR LOW POWER SYSTEM

FIELD OF INVENTION

The present invention relates to a semiconductor memory device; and, more particularly, to a semiconductor memory device for decreasing a power consumption under a low supply voltage.

DESCRIPTION OF PRIOR ART

Generally, a semiconductor memory device is operated under a supply voltage inputted from an external circuit or a low internal voltage generated by a voltage generator included in the semiconductor memory device. Particularly, people skilled in the art focus how to make a supply voltage supplied to the semiconductor memory device become lower if an operating speed of the semiconductor memory device is not decreased.

FIG. 1 is a block diagram showing a core area of a conventional semiconductor memory device.

As shown, the conventional semiconductor memory device includes a row address decoder 20, a column address decoder 30, a cell area 100 and a data input/output block 40.

The cell area 100 includes a plurality of cell arrays, e.g., 110, 120, 130 and 140 and a plurality of sense amplifying blocks, e.g., 150 and 160. The row address decoder 20 receives a row address and decodes the row address in order to access a data stored in the cell area 100; and the column address decoder 30 receives a column address and decodes the column address in order to access the data stored in the cell area 100. The data input/output block 40 is for outputting a data stored in the cell area 100 or delivering data inputted through a data pad/pin into the cell area 100.

That is, during a read operation, the data accessed in response to the row address and the column address is outputted to the data input/output block 40. Otherwise, under a write operation, a data inputted from an external circuit is stored in an unit cell corresponding to the row address and the column address through the data input/output block 40.

In detail, each cell array, e.g., 110, included in the cell area 100 includes a plurality of unit cells, each for storing a data; and each sense amplifying block, e.g., 150, is for sensing and amplifying data outputted from each cell array.

FIG. 2 is a block diagram depicting a detailed structure of the cell area 100 shown in FIG. 1.

As shown, a first cell array 110 includes a plurality of bit line pairs, e.g., BL and /BL, a plurality of cells, e.g., CELL1, CELL2 and CELL3, and a plurality of word lines, e.g., WL0 to WL5. Herein, each cell is constituted with one capacitor and one transistor. For instance, a first cell CELL1 includes a first capacitor C0 coupled to a plate line PL and a first MOS transistor M0 having a gate coupled to a first word line WL0. The first MOS transistor M0 is coupled between the first capacitor C0 and a bit line BL for connecting or disconnecting the first capacitor C0 to a bit line BL in response to a word line WL0.

Also, the first cell CELL1 and a second cell CELL2 respectively coupled to the first word line WL0 and a second word line WL1 and neighbored with each other are commonly connected to the bit line BL; and the bit line BL is coupled to a sense amplifier 152a included in the sense amplifying block 150.

For reading a data stored in the first cell CELL1, the first word line W0 is selected and activated; then, as a result, the first MOS transistor M0 is turned on. The data stored in the first capacitor C0 is delivered into the bit line BL.

Next, the sense amplifier 152a senses and amplifies the data by using a potential difference between the bit line BL receiving the data delivered through the first MOS transistor M0 and a bit line bar /BL receiving no data outputted from any cell included in the first cell array 110.

After above described sensing and amplifying operations by the sense amplifier 152a, the amplified data is outputted through a local data bus pair LDB and LDBB to the external circuit. Herein, under the sensing and amplifying operations, the sense amplifier 152a determines logic levels of the bit line BL and the bit line bar /BL. Also, each logic level of the bit line BL and the bit line bar /BL is transmitted to each of a local data bus LDB and a local data bus bar LDBB.

That is, if the first cell CELL1 stores a data being a logic high level "1", i.e., the first capacitor C0 is charged, the bit line BL has a voltage level of a supply voltage VDD and the bit line bar /BL has a voltage level of a ground GND after the sensing and amplifying operations. Otherwise, i.e., if the first cell CELL1 stores a data being a logic low level "0", the bit line BL has a voltage level of the ground GND and the bit line bar /BL has a voltage level of the supply voltage VDD after the sensing and amplifying operations.

Since an amount of charge stored in each capacitor of each cell is a little, the charge should be restored in a capacitor of each original cell after the charge is delivered into the bit line BL. After completing the restoration by using a latched data of the sense amplifier, a word line corresponding to the original cell is inactivated.

Herein, it is described when a data stored in the third cell CELL3 is read. If the third cell CELL3 stores a data being a logic high level "1", i.e., the third capacitor C2 is charged, the bit line bar /BL has a voltage level of a supply voltage VDD and the bit line BL has a voltage level of a ground GND after the sensing and amplifying operations. Otherwise, i.e., if the third cell CELL3 stores a data being a logic low level "0", the bit line bar /BL has a voltage level of the ground GND and the bit line BL has a voltage level of the supply voltage VDD after the sensing and amplifying operations.

Further, in the write operation, i.e., when an inputted data is stored in the cell area, a word line corresponding to inputted row and column addresses is activated and, then, a data stored in a cell coupled to the word line is sensed and amplified. After then, the amplified data is substituted with the inputted data in the sense amplifier 152a. That is, the inputted data is latched in the sense amplifier 152a. Next, the inputted data is stored in the cell corresponding to the activated word line. If it is completed to store the inputted data in the cell, the word line corresponding to the inputted row and column addresses is inactivated.

FIG. 3 is a block diagram describing a connection between each cell array and each sense amplifying block included in the cell area 100 shown in FIG. 1. Particularly, the conventional semiconductor memory device has a shared bit line sense amplifier structure. Herein, the shared bit line sense amplifier structure means that two neighbor cell arrays are coupled to one sense amplifying block.

As shown, there are a plurality of cell arrays 110, 130 and 180 and a plurality of sense amplifying blocks 150 and 170. The first sense amplifying block 150 is coupled to the first cell array 110 and the second cell array 130; and the second sense amplifying block 170 is coupled to the second cell array 130 and the third cell array 180.

If one cell array is coupled to one sense amplifying block, the sense amplifying block includes a plurality of sense amplifiers each corresponding to each bit line pair included in the cell array. That is, the number of the sense amplifiers included in the sense amplifying block is same to the number of bit lines included in the cell array. However, referring to FIG. 3, since two cell arrays hold one sense amplifying block in common under the shared bit line sense amplifier structure, the sense amplifying block has a number of sense amplifiers each corresponding to each two bit line pairs. That is, the number of the sense amplifiers included in the sense amplifying block can be decreased by half.

Under the shared bit line sense amplifier structure for implementing a higher integrated circuit, the sense amplifying block, e.g., 150, further includes a first connection block 151 and a second connection block 153. Since the sense amplifying block is commonly coupled to two neighbor cell arrays 110 and 130, there should be control for connecting or disconnecting the first sense amplifying block 150 to one of the two neighbor cell arrays 110 and 130. Each of the first and the second connection blocks 151 and 153 has a plurality of switching units, e.g., transistors. The plurality of transistors, e.g., MN1 to MN4, in the first connection block 151 is turned on or off based on a first connection control signal BISH1; and the plurality of transistors, e.g., MN5 to MN8, in the second connection block 153 is turned on or off based on a second connection control signal BISL1.

For instance, if the first connection control signal BISH1 is activated, all transistors included in the first connection block 151 is turned on, that is, the first cell array 110 is coupled to the sense amplifier block 152 of the first sense amplifying block 150. Otherwise, if the second connection control signal BISL1 is activated, all transistors included in the second connection block 153 is turned on, that is, the second cell array 130 is coupled to the sense amplifier block 152 of the first sense amplifying block 150.

Likewise, another sense amplifying block 170 includes a plurality of sense amplifiers and two connection blocks controlled in response to other connection control signals BISH2 and BISL2 for connecting or disconnecting a sense amplifier block of the sense amplifying block 170 to one of the two neighbor cell arrays 130 and 180.

Moreover, each sense amplifying block, e.g., 150, further includes a precharge block and a data output block except for connection blocks and sense amplifiers.

FIG. 4 is a block diagram depicting the sense amplifying block 150 shown in FIG. 2.

As shown, the sense amplifying block 150 includes a sense amplifier 152a, a precharge block 155a, first and second equalization blocks 154a and 157a and a data output block 156a.

The sense amplifier 152a receives power supply signals SAP and SAN for amplifying a potential difference between the bit line BL and the bit line bar /BL. Enabled by a precharge signal BLEQ when the sense amplifier 152a is not activated, the precharge block 155a is for precharging the bit line pair BL and /BL as a bit line precharge voltage VBLP. In response to the precharge signal BLEQ, the first equalization block 154a makes a voltage level of the bit line BL be same to a voltage level of the bit line bar /BL. Similar to the first equalization block 154a, the second equalization block 157a is also used for making a voltage level of the bit line BL be same to a voltage level of the bit line bar /BL. Lastly, the data output block 156a outputs a data amplified by the sense amplifier 152a to the local data bus pair LDB and LDBB based on a column control signal YI generated from a column address.

Herein, the sense amplifying block 150 further includes two connection blocks 151a and 153a each for connecting or disconnecting the sense amplifier 152a to one of neighbor cell arrays respectively based on connection control signals BISH and BISL.

FIG. 5 is a waveform showing an operation of the conventional semiconductor memory device. Hereinafter, referring to FIGS. 1 to 5, the operation of the conventional semiconductor memory device is described in detail.

As shown, the read operation can be split into four steps: a precharge step, a read step, a sense step and a restore step. Likewise, the write operation is very similar to the read operation. However, the write operation includes a write step instead of the read step in the read operation and, more minutely, not a sensed and amplified data is not outputted but an inputted data from an external circuit is latched in the sense amplifier during the sense step.

Hereinafter, it is assumed that a capacitor of a cell is charged, i.e., stores a logic high data "1". Herein, a symbol 'SN' means a potential level charged in the capacitor of the cell. Also, one of two connection blocks in the sense amplifying block is activated and the other is inactivated. As a result, the sense amplifying block is coupled to one of two neighbor cell arrays.

In the precharge step, the bit line BL and the bit line bar /BL are precharged by the bit line precharge voltage VBLP. At this time, all word line are inactivated. Generally, the bit line precharge voltage VBLP is a ½ core voltage, i.e., ½ Vcore=VBLP.

When the precharge signal BLEQ is activated as a logic high level, the first and second equalization blocks 154a and 157a are also enabled. Thus, the bit line BL and the bit line bar /BL are percharged as the ½ core voltage. Herein, the first and second connection block 151a and 153a are also activated, i.e., all transistors included in the first and second connection block 151a and 153a are turned on.

In the read step, a read command is inputted and carried out. Herein, if the first connection block 151a is coupled to the first cell array 110 and the second connection block 153a is coupled to the second cell array 130, the sense amplifier 152a is coupled to the first cell array 110 when the first connection block 151a is activated and the second connection block 153a is inactivated. Otherwise, when the second connection block 153a is activated and the first connection block 151a is inactivated, the sense amplifier 152a is coupled to the second cell array 130 and disconnected to the first cell array 110.

In addition, a word line corresponding to an inputted address is activated by a supply voltage VDD or a high voltage VPP until the restore step.

Herein, for activating the word line, the high voltage VPP is generally used because it is requested that the supply voltage VDD becomes lower and an operating speed of the semiconductor memory device becomes faster.

If the word line is activated, a MOS transistor of the cell corresponding to the word line is turned on; and a data stored in a capacitor of the cell is delivered into the bit line BL.

Thus, the bit line BL precharged by the ½ core voltage is boosted up by a predetermined voltage level $\Delta V$. Herein, though the capacitor is charged as the core voltage Vcore, a voltage level of the bit line BL cannot be increased to the core voltage Vcore because a capacitance Cc of the capacitor is smaller than a worm capacitance Cb of the bit line BL.

Referring to FIG. 5, in the read step, it is understood that a voltage level of the bit line BL is increased by the predetermined voltage level $\Delta V$ and the symbol 'SN' is also decreased to that voltage level.

At this time, i.e., when the data is delivered into the bit line BL, no data is delivered into the bit line bar /BL and, then, the bit line bar /BL keeps a ½ core voltage level.

Next, in the sense step, the first power supply signal SAP is supplied with the core voltage Vcore and the second power supply signal SAN is supplied with a ground GND. Then, the sense amplifier can amplify a voltage difference, i.e., a potential difference, between the bit line BL and the bit line bar /BL by using the first and the second power supply signals SAP and SAN. At this time, a relatively high side between the bit line BL and the bit line bar /BL is amplified to the core voltage Vcore; and the other side, i.e., a relatively low side between the bit line BL and the bit line bar /BL, is amplified to the ground GND.

Herein, a voltage level of the bit line BL is higher than that of the bit line bar /BL. That is, after the bit line BL and the bit line bar /BL are amplified, the bit line BL is supplied with the core voltage Vcore and the bit line bar /BL is supplied with the ground GND.

Lastly, in the restore step, the data outputted from the capacitor during the read step for boosting up the bit line BL by the predetermined voltage level $\Delta V$ is restored in the original capacitor. That is, the capacitor is re-charged. After the restore step, the word line corresponding to the capacitor is inactivated.

Then, the conventional semiconductor memory device carries out the precharge step again. Namely, the first and the second power supply signals SAP and SAN are respectively supplied with ½ core voltage Vcore. Also, the precharge signal BLEQ is activated and inputted to the first and the second equalization blocks 154a and 157a and the precharge block 155a. At this time, the sense amplifier 152a is coupled to the two neighbor cell arrays, e.g., 110 and 130, by the first and the second connection blocks 151a and 153a.

As a design technology for a semiconductor memory device is rapidly developed, a voltage level of a supply voltage for operating the semiconductor memory device becomes lower. However, though the voltage level of the supply voltage becomes lower, it is requested that an operation speed of the semiconductor memory device becomes faster.

For achieving the request about the operation speed of the semiconductor memory device, the semiconductor memory device includes an internal voltage generator for generating a core voltage Vcore having a lower voltage level than the supply voltage VDD and a high voltage VPP having a higher voltage level than the core voltage Vcore.

Until now, a requested operation speed can be achieved by implementing a nano-scale technology for manufacturing the semiconductor memory device through using above described manner for overcoming a decrease of the voltage level of the supply voltage VDD without any other particular method.

For example, through a voltage level of the supply voltage is decreased from about 3.3 V to about 2.5 V or under 2.5 V, the requested operation speed is achieved if the nano-scale technology is implemented based on from about 500 nm to about 100 nm. This means that the semiconductor memory device is more integrated. That is, as the nano-scale technology is upgraded, i.e., developed, a power consumption of a fabricated transistor included in the semiconductor memory device is reduced and, if the voltage level of the supply voltage is not decreased, an operation speed of the fabricated transistor becomes faster.

However, on the nano-technology based on under 100 nm, it is very difficult to develop the nano-technology. That is, there is a limitation for integrating the semiconductor memory device more and more.

Also, a requested voltage level of the supply voltage becomes lower, e.g., from about 2.0 V to about 1.5 V or so far as about 1.0 V. Thus, the request about the supply voltage cannot be achieved by only developing the nano-technology.

If a voltage level of the supply voltage inputted to the semiconductor memory device is lower than a predetermined voltage level, an operating margin of each transistor included in the semiconductor memory device is not sufficient; and, as a result, a requested operation speed is not satisfied and an operation reliability of the semiconductor memory device is not guaranteed.

Also, the sense amplifier needs more time for stably amplifying a voltage difference between the bit line BL and the bit line bar /BL because a predetermined turned-on voltage, i.e., a threshold voltage, of the transistor is remained under a low supply voltage.

Moreover, if a noise is generated at the bit line pair BL and /BL, each voltage level of the bit line BL and the bit line bar /BL is fluctuated, i.e., increased or decreased by a predetermined level on the ½ core voltage Vcore. That is, as the voltage level of the supply voltage becomes lower, a little noise can seriously affect the operation reliability of the semiconductor memory device.

Therefore, there is a limitation for decreasing a voltage level of the supply voltage under a predetermined level.

In addition, as the semiconductor memory device is more integrated, a size of the transistor becomes smaller and a distance between a gate of the transistor and the bit line gets near more and more. As a result, a bleed current is generated. Herein, the bleed current means a kind of leakage current between the gate of the transistor and the bit line because of a physical distance between the gate of the transistor and the bit line under a predetermined value.

FIG. 6 is a cross-sectional view describing an unit cell of the semiconductor memory device in order to show a cause of the bleed current.

As shown, the unit cell includes a substrate 10, an device isolation layer 11, source and drain regions 12a and 12b, a gate electrode 13, a bit line 17, a capacitor 14 to 16 and insulation layers 18 and 19. Herein, the symbol 'A' means a distance between the gate electrode 13 of the transistor and the bit line 17.

As it is rapidly developed the nano-technology for manufacturing the semiconductor memory device, the distance between the gate electrode 13 of the transistor and the bit line 17, i.e., 'A', becomes shorter.

In the precharge step, the bit line BL is supplied with the ½ core voltage and the gate electrode 13, i.e., a word line, is supplied with the ground.

If the bit line 17 and the gate electrode 13 in an unit cell are electronically short since an error is occurred under a manufacturing process, a current is flown continuously during the precharge step and a power consumption is increased. In this case, the semiconductor memory device includes a plurality of additional unit cells for substituting the unit cell where the bit line and the gate electrode are short electronically. At this time, error cells is substituted with additional cells in word line basis.

Otherwise, if there is no error under the manufacturing process, i.e., the bit line 17 and the gate electrode 13 in an unit cell are not electronically short in any cell of the semiconductor memory device, there is no bleed current. However, if the distance between the gate electrode 13 of the transistor and the bit line 17, i.e., 'A', is too short without any error under the manufacturing process, the bleed current is generated and flown.

Recently, how to operate a semiconductor memory device under a low power condition is very important. If above described bleed current is generated, it is not appreciate that the semiconductor memory device having the bleed current is applied to a system though the semiconductor memory device can be normally operated.

For reducing an amount of the bleed current, it is suggested that a resistor is added between the gate electrode of the transistor and the bit line. However, although the resistor can reduce little amount of the bleed current, this is not effective and essential for reducing and protecting a flow of the bleed current.

In the other hand, if a bit line pair is precharged as a ground, a voltage level of an inactivated word line is the same to that of the bit line pair and, then, there is no bleed current between the bit line pair and the word line.

However, if the bit line pair is precharged as the ground, one of the bit line pair is supplied with a supply voltage and the other of the bit line pair is supplied with a ground before the bit line pair is precharged again after a data is outputted to a local data line pair. Then, in order to precharge the bit line pair as the ground, one of the bit line pair supplied with the supply voltage is discharged to the ground. That is, a voltage level of one of the bit line pair having a supply voltage level is pulled down to a ground level. As a result, a power consumption is additionally occurred.

If the semiconductor memory device employs a half precharge method, i.e., a method for using a half supply voltage ½ VDD as a bit line precharge voltage, which is well known to those skilled in the art, one and the other of the bit line pair respectively amplified to the supply voltage and the ground are equalized in order to precharge the bit line pair again. After then, the half supply voltage ½ VDD is continuously supplied to the bit line pair.

In this case, there is no additional power consumption occurred when the bit line pair is precharged again as the ground.

However, if the half supply voltage ½ VDD is used as the bit line precharge voltage, the bleed current between the bit line pair and the inactivated word line is generated. As a result, under a low power system or a system supplied with a low level supply voltage, the semiconductor memory device employing the half precharge method is not proper. Namely, it is very difficult to apply the semiconductor memory device employing the half precharge method to the low power system.

SUMMARY OF INVENTION

It is, therefore, an object of the present invention to provide a semiconductor device for reducing a power consumption during a precharge operation and protecting a bleed current from generating to thereby reduce a power consumption.

It is, therefore, another object of the present invention to provide a semiconductor device for operating in a fast speed under a low power condition.

In accordance with an aspect of the present invention, there is provided a semiconductor memory device for outputting or storing a data in response to inputted address and command including a first cell array for outputting the data to one of a bit line and a bit line bar; a first reference cell block for outputting a reference signal to the other of the bit line and the bit line bar; a sense amplifying block for sensing and amplifying a voltage difference between the bit line and the bit line bar; and a floating control block for floating the bit line and the bit line bar if a precharge command signal is activated.

In accordance with another aspect of the present invention, there is provided a method for performing a read operation and a write operation of a semiconductor memory device based on an inputted address and an inputted command, including the steps of: a) delivering a data stored in a cell array into one of a bit line and a bit line bar; b) delivering a reference signal generated from a reference cell block into the other of the bit line and the bit line bar; c) sensing and amplifying a voltage difference between the data and the reference signal by using a low voltage and a high voltage; and d) floating the bit line and the bit line bar in response to a precharge command signal.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device for operating under a low power condition according to the present invention will be described in detail referring to the accompanying drawings.

Figure 1:
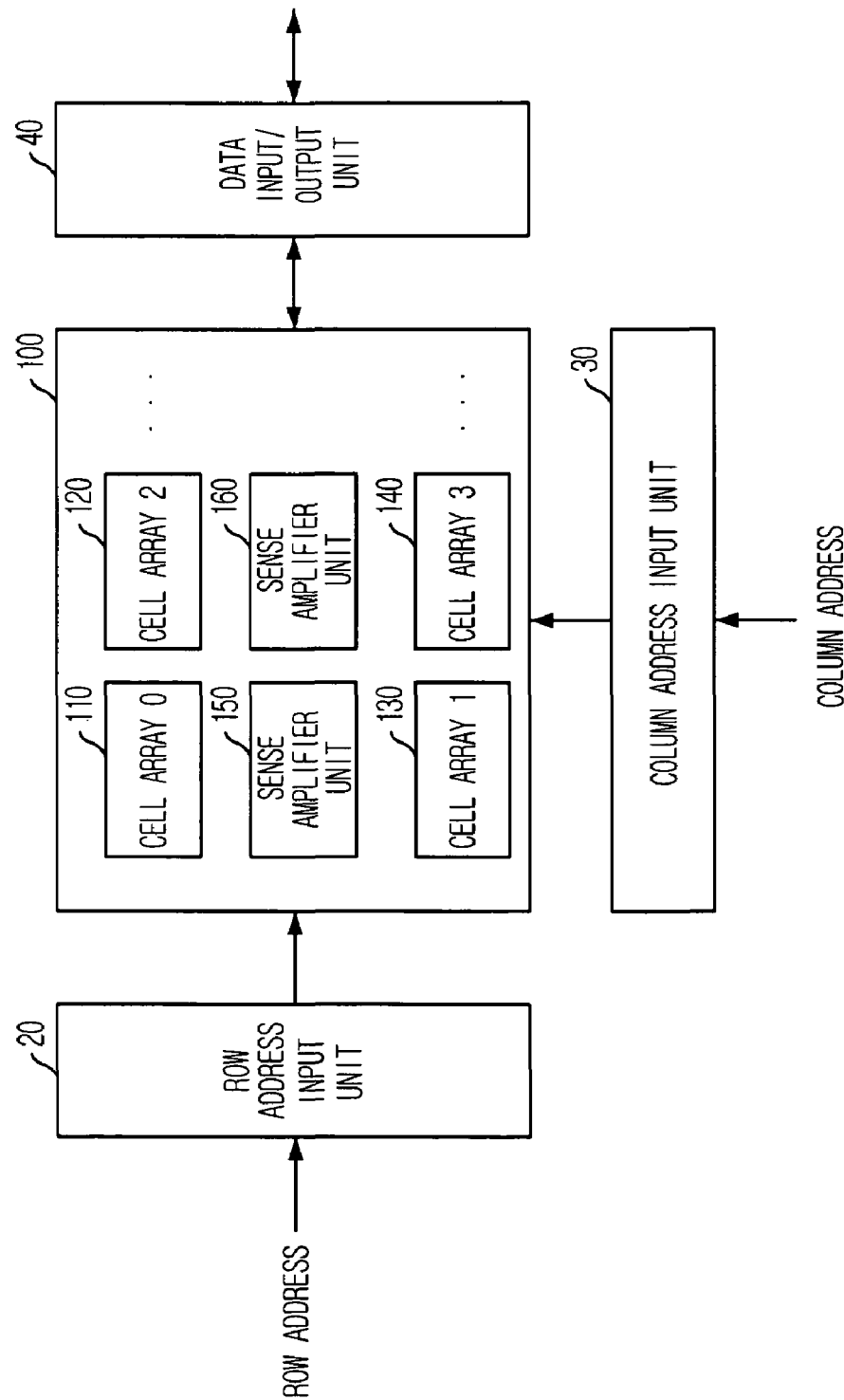
FIG. 1 is a block diagram showing a core area of a conventional semiconductor memory device.
Figure 2:
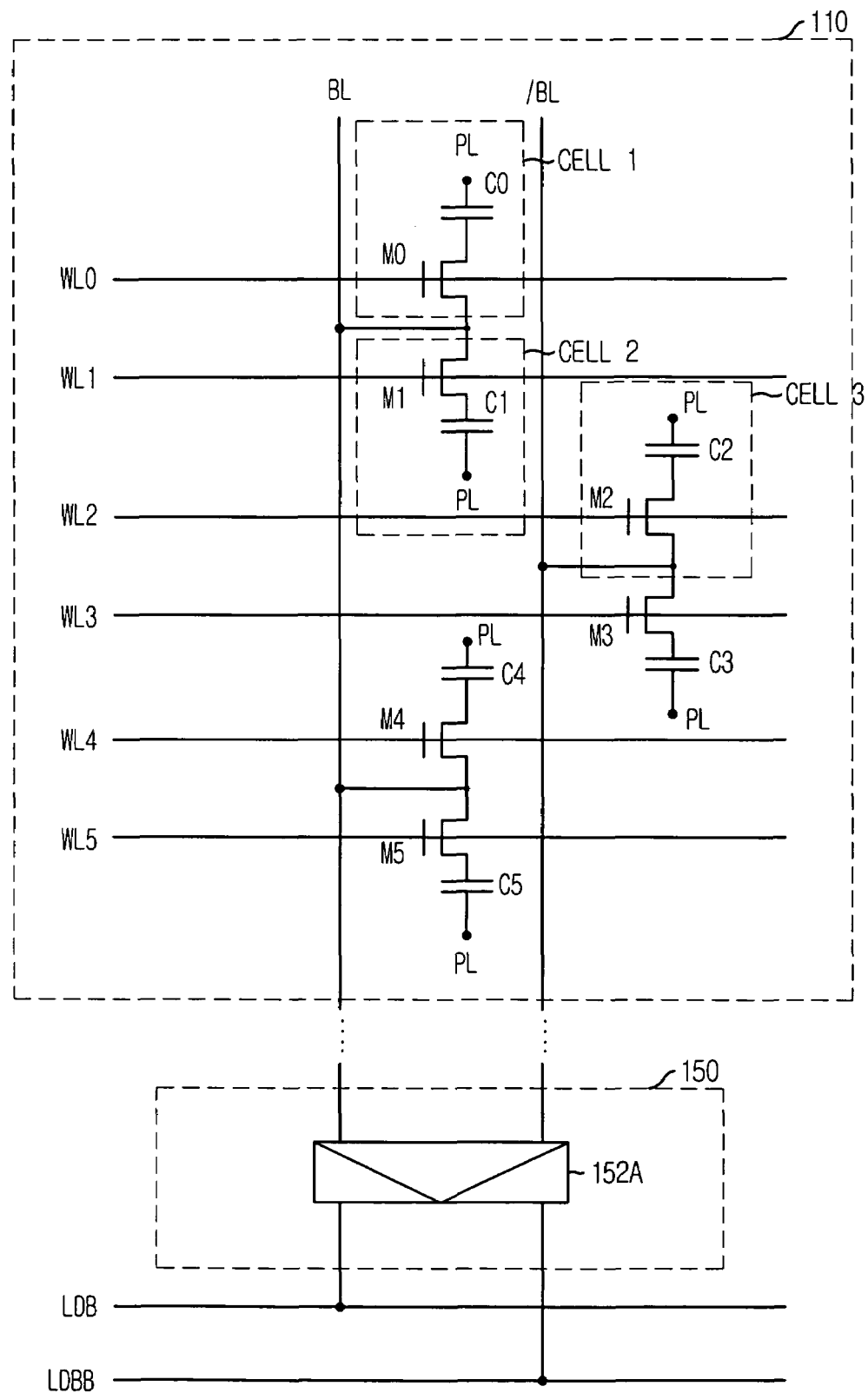
FIG. 2 is a block diagram depicting a detailed structure of the cell area shown in FIG. 1.
Figure 3:
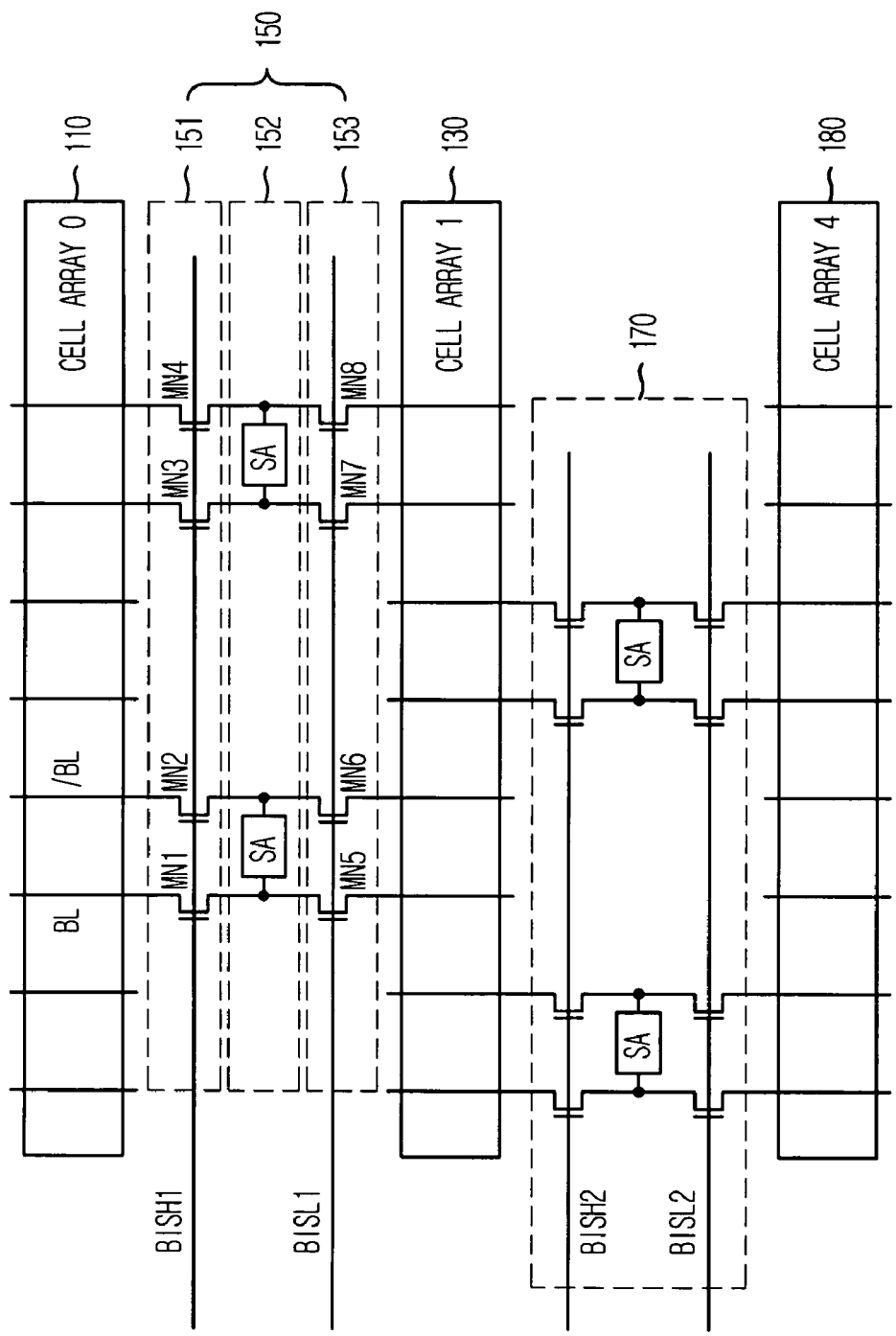
FIG. 3 is a block diagram describing a connection between each cell array and each sense amplifying block included in the cell area shown in FIG. 1.
Figure 4:
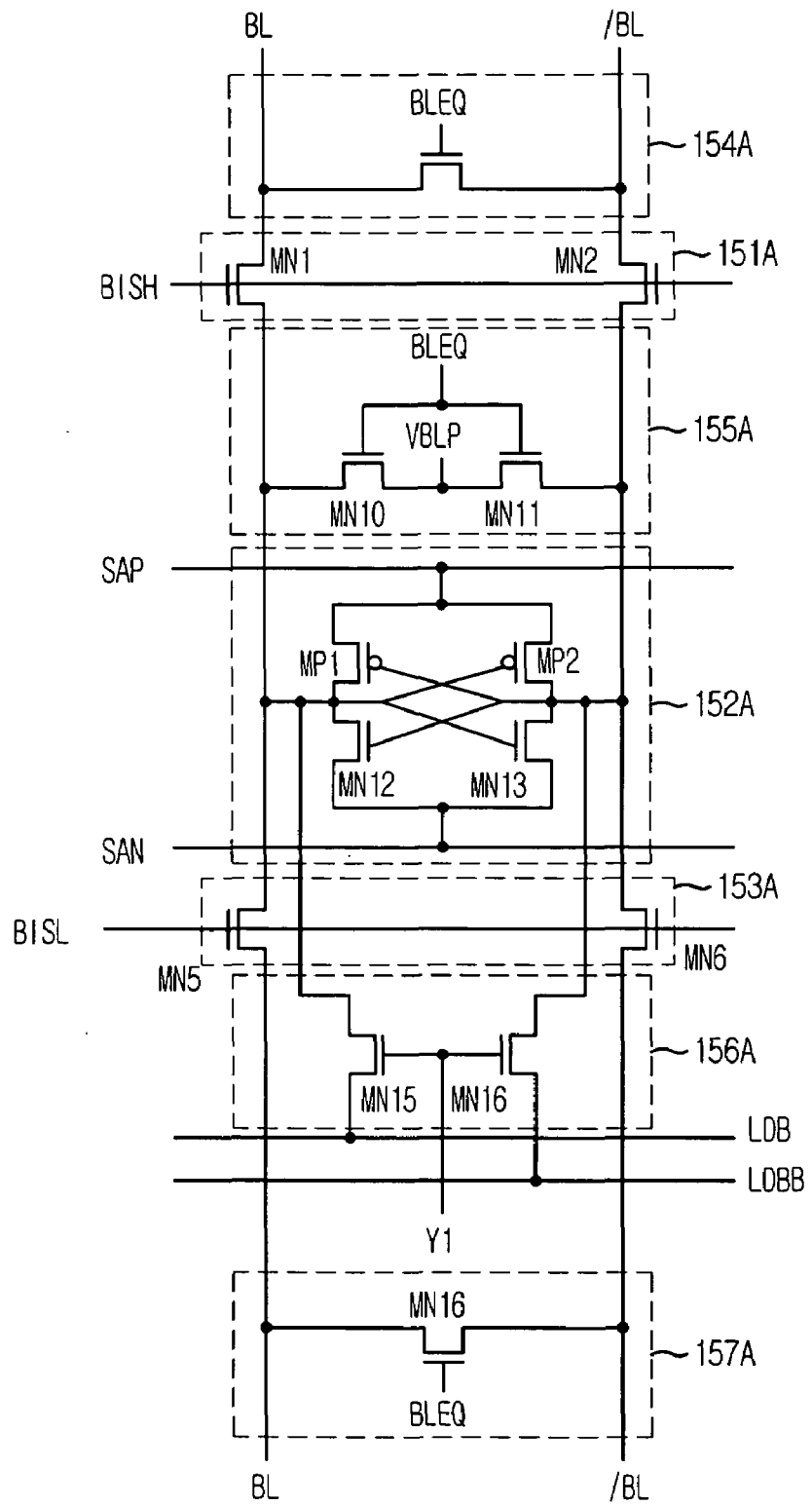
FIG. 4 is a block diagram depicting the sense amplifying block 150 shown in FIG. 2.
Figure 5:
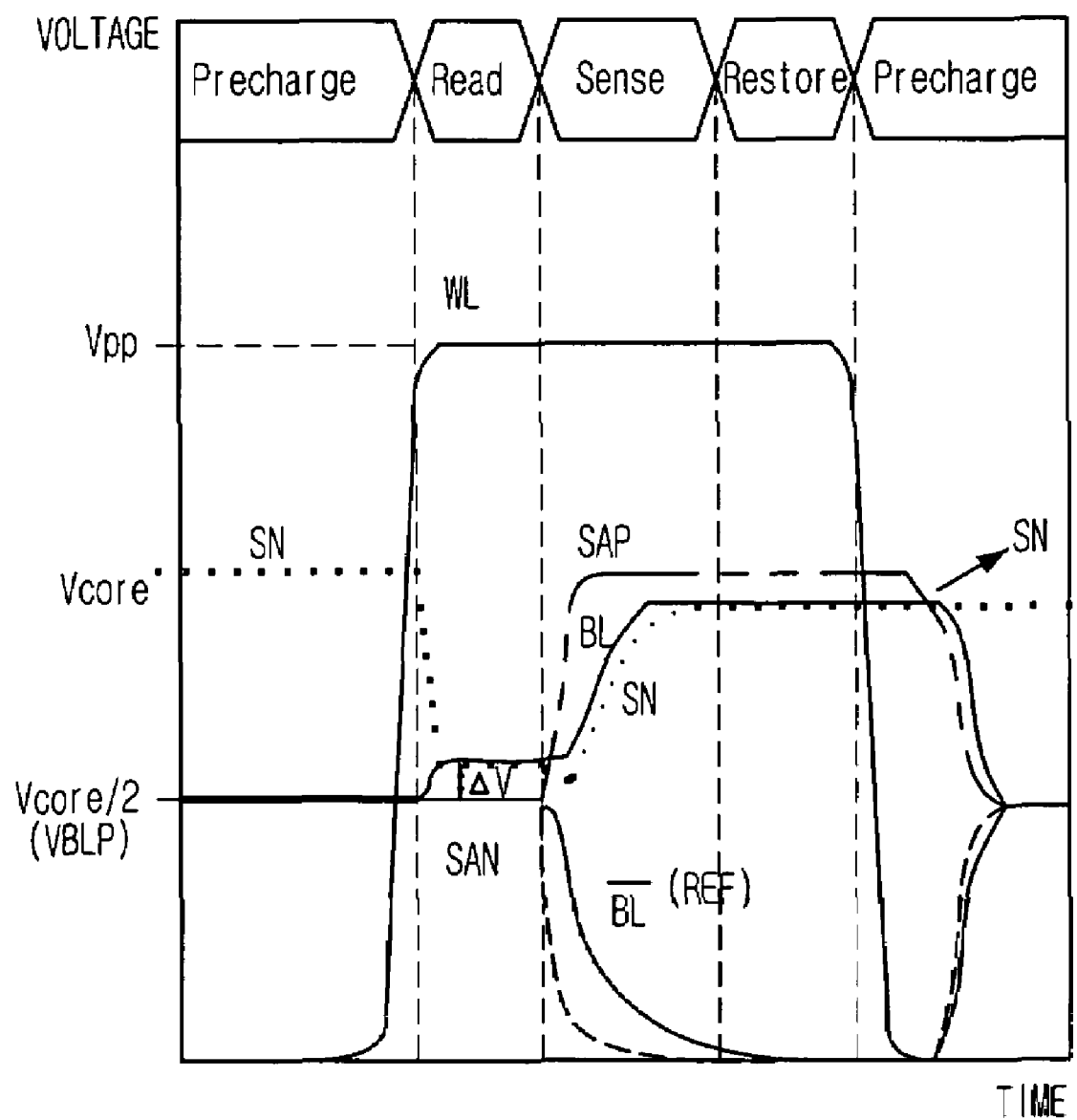
FIG. 5 is a waveform showing an operation of the conventional semiconductor memory device.
Figure 6:
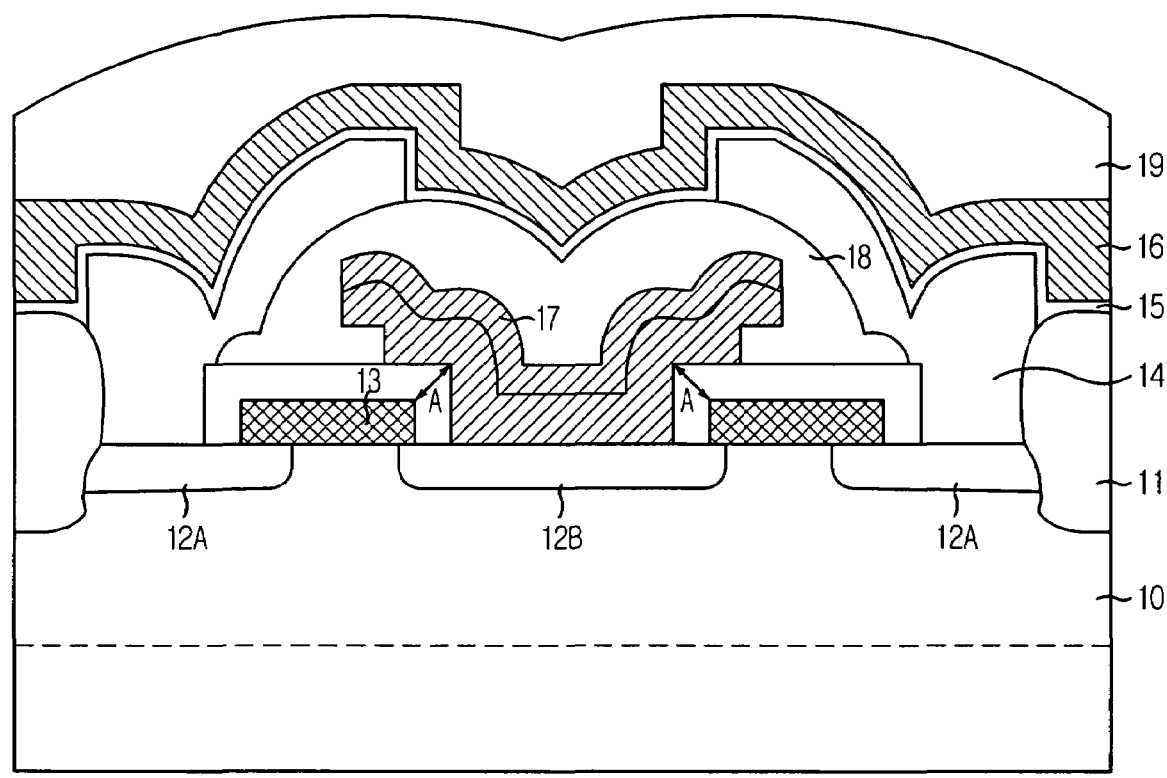
FIG. 6 is a cross-sectional view describing an unit cell of the semiconductor memory device in order to show a cause of the bleed current.
Figure 7:
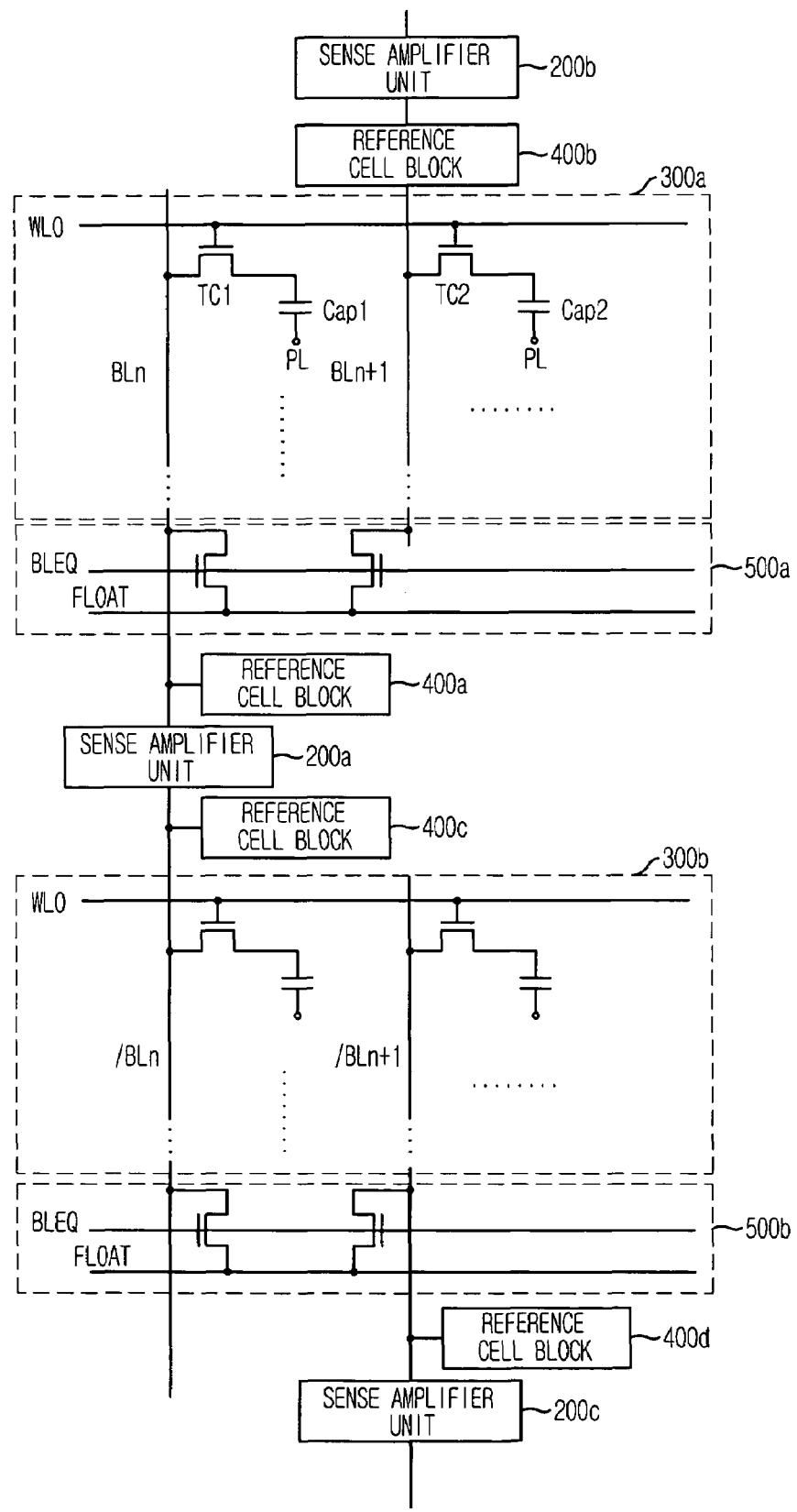
FIG. 7 is a block diagram showing a semiconductor memory device in accordance with the present invention.

FIG. 7 is a block diagram showing a semiconductor memory device in accordance with the present invention.

As shown, the semiconductor memory device includes first to fourth reference cell blocks 400a to 400d, first and second cell arrays 300a and 300b, and first and second sense amplifying blocks 200a and 200b. In detail, the first and second reference cell blocks 400a and 400b are respectively coupled to a first bit line BLn and a second bit line BLn+1 of the first cell array 300a. Also, the third and fourth reference cell blocks 400c and 400d are respectively coupled to a first bit line bar /BLn and a second bit line bar /BLn+1 of the second cell array 300b.

Further, the semiconductor memory device includes a first and a second floating control block 500a and 500b, each for floating the bit line, e.g., BLn, and the bit line bar, e.g., /BLn, if a precharge command signal BLEQ is activated.

In detail, the first floating block 500a has a plurality of MOS transistors for floating each bit line BLn included in the first cell array 300a to thereby equalize each voltage level of the bit lines BLn. Each MOS transistor included in the first floating block 500a is turned on in response to the precharge command signal BLEQ. As a result, if the precharge command signal BLEQ is activated, each bit line is coupled to a floating line FLOAT and, then, a voltage level of each bit line is equalized.

Likewise, the second floating block 500b has a plurality of MOS transistors for floating each bit line bar /BLn included in the second cell array 300b to thereby equalize each voltage level of the bit lines bar /BLn. Each MOS transistor included in the second floating block 500b is turned on in response to the precharge command signal BLEQ. As a result, if the precharge command signal BLEQ is activated, each bit line is coupled to a floating line FLOAT and, then, a voltage level of each bit line bar is equalized.

In the semiconductor memory device according to the present invention, any voltage is not supplied with each bit line or each bit line bar included in each cell array during a precharge period, i.e., when a precharge command signal BLEQ is activated. Thus, if the semiconductor memory device has the floating block, e.g., 500a, the voltage level of each bit line in the cell array can be equalized.

However, if it is not necessary to equalize the voltage level of each bit line in the cell array, the semiconductor memory device does not need to include the floating block. If there is not floating block in the semiconductor memory device, each bit line has different voltage level during the precharge period. In this case, if there is the voltage difference when a data signal is loaded to one of the bit line and the bit line pair, the sense amplifier can sense and amplify a voltage difference between the bit line and the bit line pair. Thus, a data read/write operation or a refresh operation is performed under above described condition that each bit line in the cell array has different voltage level.

Herein, each cell array, e.g., 300a, includes a plurality of unit cells, each for storing a data and outputting the data to one of a bit line and a bit line bar in response to inputted address and command; and the sense amplifying block 200 is for sensing and amplifying data outputted from each cell array. The first cell array 300a is coupled to the sense amplifying block 200 through a plurality of bit lines, e.g., BLn and BLn+1. The second cell array 300b is coupled to the sense amplifying block 200 through a plurality of bit line bars, e.g., /BLn and /BLn+1.

In detail, each unit cell included in the first and the second cell arrays 300a and 300b is constituted with one capacitor, e.g., Cap1, and one transistor, e.g., TC1.

The first and the second reference cell blocks 400a and 400b are for supplying a reference signal to the sense amplifying block 200 through the plurality of bit lines, e.g., BLn and BLn+1, and the plurality of bit line bars, e.g., /BLn and /BLn+1.

Figure 8:
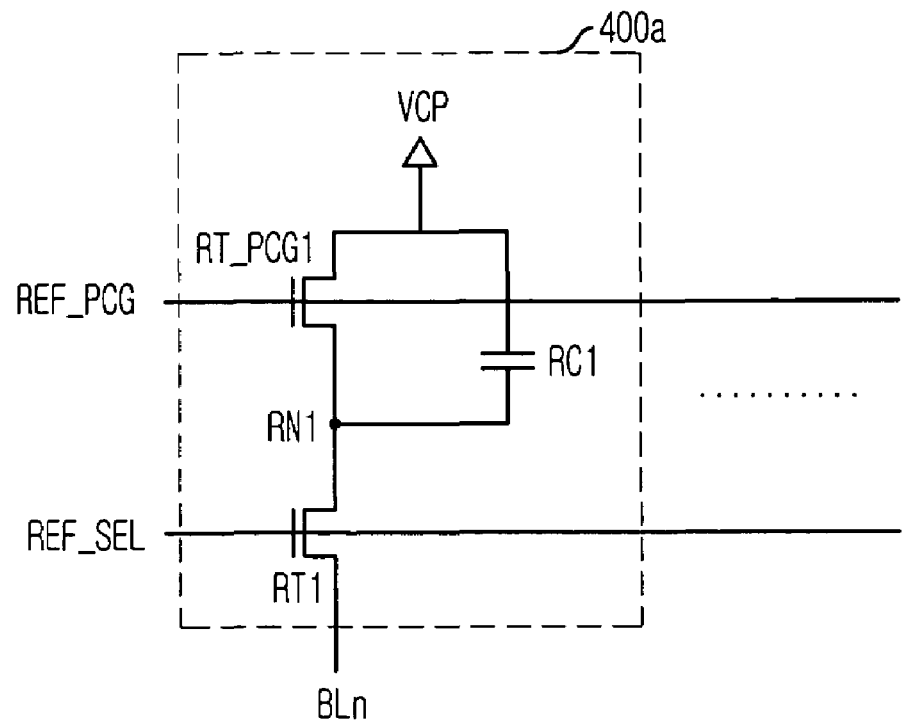
FIG. 8 is a block diagram describing a reference cell block shown in FIG. 7 in accordance with an embodiment of the present invention.
Figure 8:
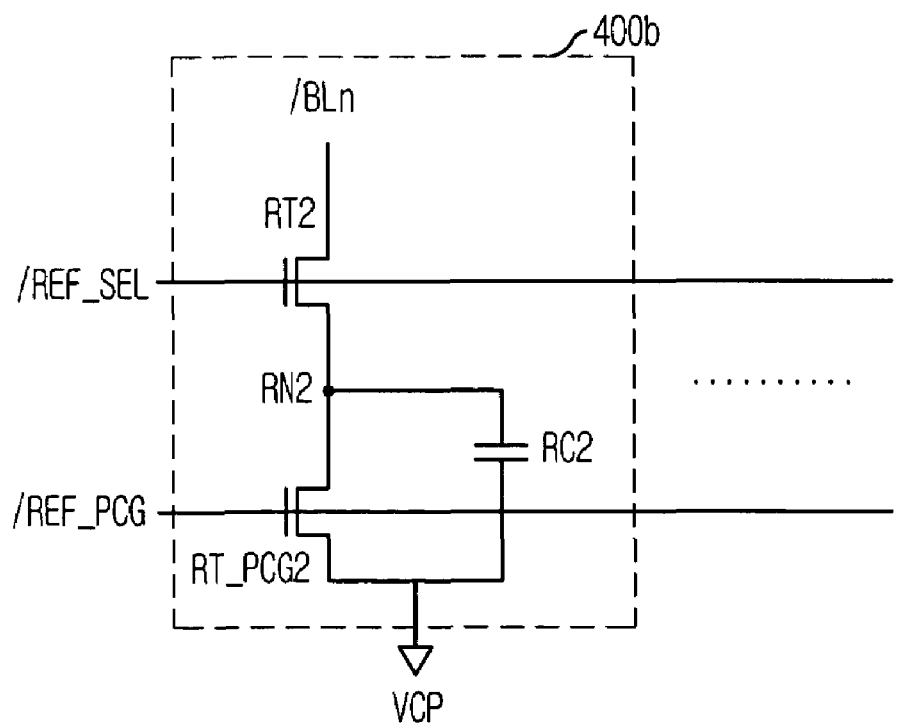

FIG. 8 is a block diagram describing the first and the second reference cell blocks 400a and 400b shown in FIG. 7.

As shown, the first reference cell block 400a includes a first capacitor RC1 for receiving a reference supply voltage VCP to thereby generate the reference signal; a first transistor RT1 for transmitting the reference signal in response to a reference selection signal REF_SEL; and a second transistor RT_PCG1 for charging the first capacitor RC1 in response to a reference cell precharge signal REF_PCG.

Likewise, the second reference cell block 400b includes a second capacitor RC2 for receiving the reference supply voltage VCP to thereby generate the reference signal; a third transistor RT2 for transmitting the reference signal in response to an inverse reference selection signal /REF_SEL; and a fourth transistor RT_PCG2 for charging the capacitor in response to an inverse reference cell precharge signal.

Herein, each capacitance of the first and the second capacitors RC1 and RC2 is identical to a capacitance of each unit cell included in the first and the second cell arrays 300a and 300b.

Further, the reference supply voltage VCP is one of the supply voltage VDD, a ½ supply voltage ½VDD and the ground GND. In the present invention, a voltage level of the reference supply voltage VCP is identical to that of a plate voltage PL of the unit cell.

Also, the number of the first and the second reference cell blocks 400a and 400b is determined based on the number of the bit lines included in the first cell array 300a. Herein, the total number of the first and the second reference cell blocks 400a and 400b is identical to the total number of the bit lines BLn and BLn+1 included in the first cell array 300a, and the total number of the third and the fourth reference cell blocks 400c and 400d is identical to the total number of the bit line bars /BLn and /BLn+1 included in the second cell array 300b.

For example, if 1024 number of bit lines are included in the first cell array 300a, the number of the reference cell blocks is 1024.

In the semiconductor memory device according to the present invention, the first reference cell block 400a outputs a reference signal to the bit line BLn when the second cell array 300b outputs a data to the sense amplifier 210 through the bit line bar /BLn. Likewise, the third reference cell block 400c outputs the reference signal to the bit line bar /BLn when the first cell array 300a outputs a data to the sense amplifier 210 through the bit line BLn.

Figure 9:
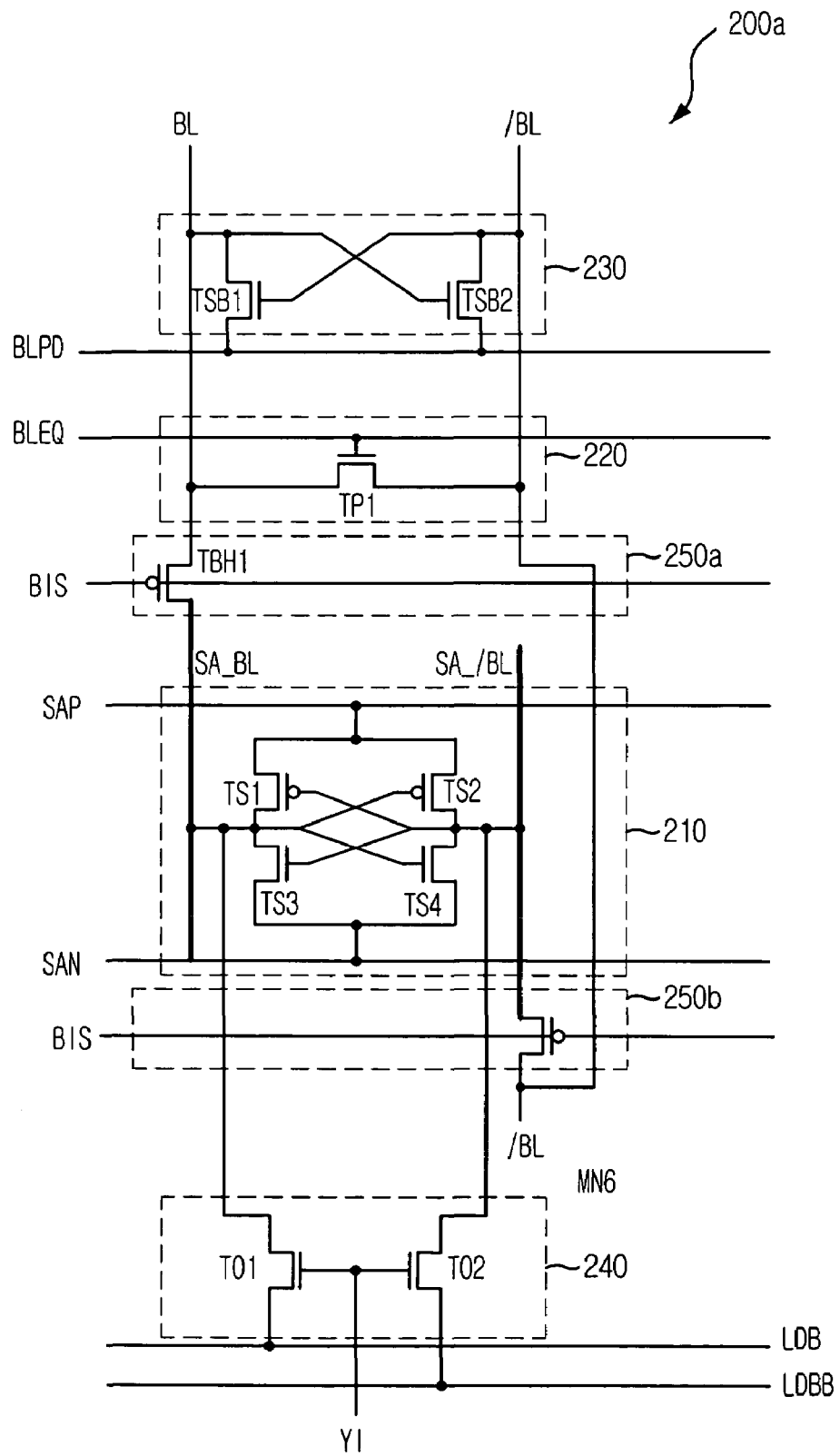
FIG. 9 is a circuit diagram depicting a sense amplifying block shown in FIG. 7.

FIG. 9 is a circuit diagram depicting the sense amplifying block 200a shown in FIG. 7.

As shown, the sense amplifying block 200a includes a precharge block 220, a first and a second connection blocks 250a and 250b, a sense amplifier 210, a sub sense amplifier 230 and a data output block 240. In the semiconductor memory device shown in FIG. 7, two neighbor cell arrays, i.e., 300a and 300b are coupled to the sense amplifying block 200a.

In detail, an unit cell included in the first cell array 300a is coupled to the sense amplifier 210 through a bit line BLn and an unit cell included in the second cell array 300b is coupled to the sense amplifier 210 through a bit line bar /BLn. Herein, there are a first precharge block 220a and a first connection block 250a located between the first cell array 300a and the sense amplifier 210. Likewise, there are a second precharge block 220b and a second connection block 250b located between the second cell array 300b and the sense amplifier 210.

The sense amplifier 210 receives a first power supply signal SAP and a second power supply signal SAN for amplifying a potential difference, i.e., a voltage difference, between the bit line BLn and the bit line bar /BLn. When the sense amplifier 210 is activated, a high voltage VPP is inputted as the first power supply signal SAP and a low voltage VBB is inputted as the second power supply signal SAN. If the sense amplifier 210 is inactivated, a ground GND or the low voltage VBB is inputted as the first power supply signal SAP, and ½ supply voltage, i.e., half VDD, is inputted as the second power supply signal SAN.

Herein, the high voltage VPP has a higher voltage level than a supply voltage VDD inputted from an external circuit; and the low voltage VBB has a lower voltage level than the ground GND.

Furthermore, the sense amplifying block 210 includes the first and the second connection blocks 250a and 250b, each for delivering a data loaded in the bit line or the bit line bar into the sense amplifier and preventing the low voltage VBB from delivering into the bit line and the bit line bar respectively coupled to the cell array.

For example, if a data stored in the first cell array 300a is outputted through the bit line BL in response to an inputted command, the first connection block 250a is activated. As a result, the data can be delivered to the sense amplifier 210. And then, in order to prevent the low voltage from supplying to the bit line BL connected to the first cell array 300a, the first connection block 250a is inactivated during the sense amplifier senses and amplifiers a voltage difference between the bit line BL and the bit line bar /BL. Likewise, if a data stored in the second cell array 300b is outputted through the bit line bar /BL in response to an inputted command, the second connection block 250b is activated. As a result, the data can be delivered to the sense amplifier 210. And then, in order to prevent the low voltage VBB from supplying to the bit line bar /BL connected to the second cell array 300b, the second connection block 250b is inactivated during the sense amplifier senses and amplifiers a voltage difference between the bit line BL and the bit line bar /BL.

In addition, the sense amplifying block 200 includes the sub sense amplifier 230 amplifies one of the bit line BL and the bit line bar /BL to prevent a data destroy based on the low voltage VBB.

In detail, the sub sense amplifying block 230 includes a first NMOS transistor TSB1 having a gate, a drain and a source, the gate coupled to the bit line bar /BL, the source for receiving a bit line voltage control signal BLPD and the drain coupled to the bit line BL; and a second NMOS transistor TSB2 having a gate, a drain and a source, the gate coupled to the bit line BL, the source for receiving the bit line voltage control signal BLDP and the drain coupled to the bit line bar /BL.

Further, the bit line voltage control signal BLPD is inputted to the sub sense amplifier 230 as the ground when the bit line sense amplifier 210 is activated.

Enabled by the precharge command signal BLEQ when the sense amplifier 210 is not activated, the first precharge block 220 is for equalizing each voltage level of the bit line BL and the bit line bar /BL.

Lastly, the data output block 240 outputs a data amplified by the sense amplifier 210 to a local data line pair, i.e., LDB and LDBB, in response to a column select signal YI based on an inputted column address.

Namely, after the sense amplifying block 210 senses and amplifies a data by using the high voltage VPP and the low voltage VBB, the data is delivered into the local data line pair. That is, the high voltage VPP and the low voltage VBB is respectively inputted as the first power supply signal SAP and the second power supply signal SAN. Then, the precharge block 220 is activated for equalizing the bit line BL and the bit line bar /BL. In the present invention, even though the precharge block 220 is activated, there is no voltage supplied with the bit line BL and the bit line bar /BL.

The sense amplifying block 210 includes a first and a second PMOS transistors TS1 and TS2 and a first and a second NMOS transistors TS3 and TS4.

The first PMOS transistor TS1 has a gate, a drain and a source, the gate coupled to a sense amp bit line bar SA_/BL, the source for receiving the first power supply signal SAP and the drain coupled to a sense amp bit line BL SA_BL. And, the second PMOS transistor TS2 has a gate, a drain and a source, the gate coupled to the sense amp bit line SA_BL, the source for receiving the first power supply signal SAP and the drain coupled to the sense amp bit line bar SA_/BL.

The first NMOS transistor TS3 has a gate, a drain and a source, the gate coupled to the sense amp bit line bar SA_/BL, the source for receiving the second power supply signal SAN and the drain coupled to the sense amp bit line SA_BL; and the second NMOS transistor TS4 has a gate, a drain and a source, the gate coupled to the sense amp bit line SA_BL, the source for receiving the second power supply signal SAN and the drain coupled to the sense amp bit line bar SA_/BL.

After amplified by the sense amplifier 210, the data is transmitted to a local data line LDB and a local data line bar LDBB through the data output block 240.

The data output block 240 is for delivering the data amplified by the sense amplifying block 210 into a local data line LDB and a local data line bar LDBB or delivering an inputted data through the local data line LDB and the local data line bar LDBB into the sense amplifying block 210.

In detail, the data output block 240 includes a first and a second MOS transistors TO1 and TO2. The first MOS transistor TO1 is coupled between the bit line BL and the local data line LDB for delivering a data amplified by the sense amplifier 210 into the local data line LDB or delivering an inputted data through the local data line LDB into the sense amplifying block 210 in response to a column control signal YI based on an inputted column address. Also, the second MOS transistor TO2 is coupled between the bit line bar /BL and the local data line bar LDBB for delivering a data amplified by the sense amplifier 210 into the local data line bar LDBB or delivering an inputted data through the local data line bar LDBB into the sense amplifying block 210 in response to the column control signal YI.

Figure 10:
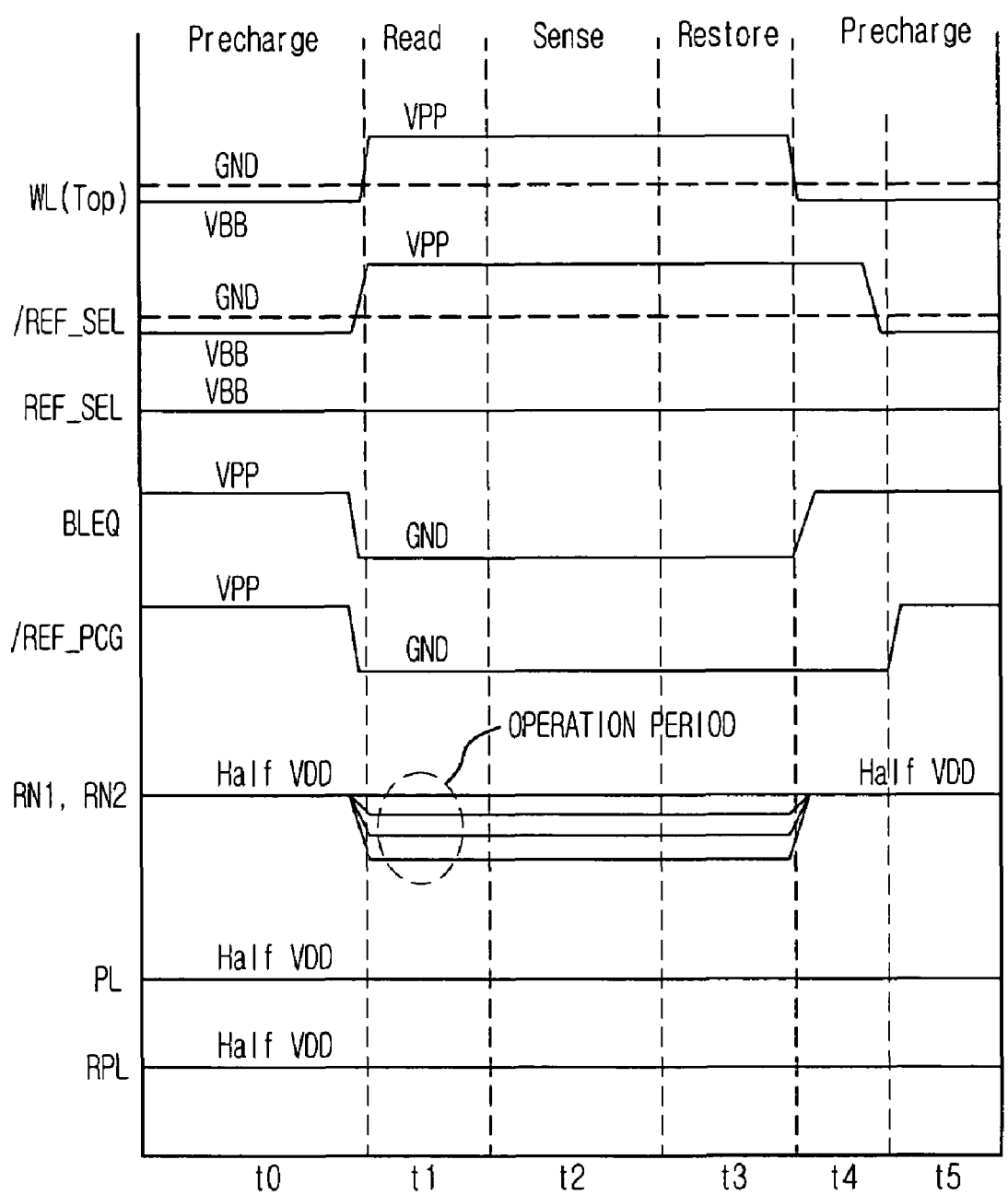
FIG. 10 is a waveform showing an operation of the semiconductor memory device shown in FIG. 7.
Figure 11:
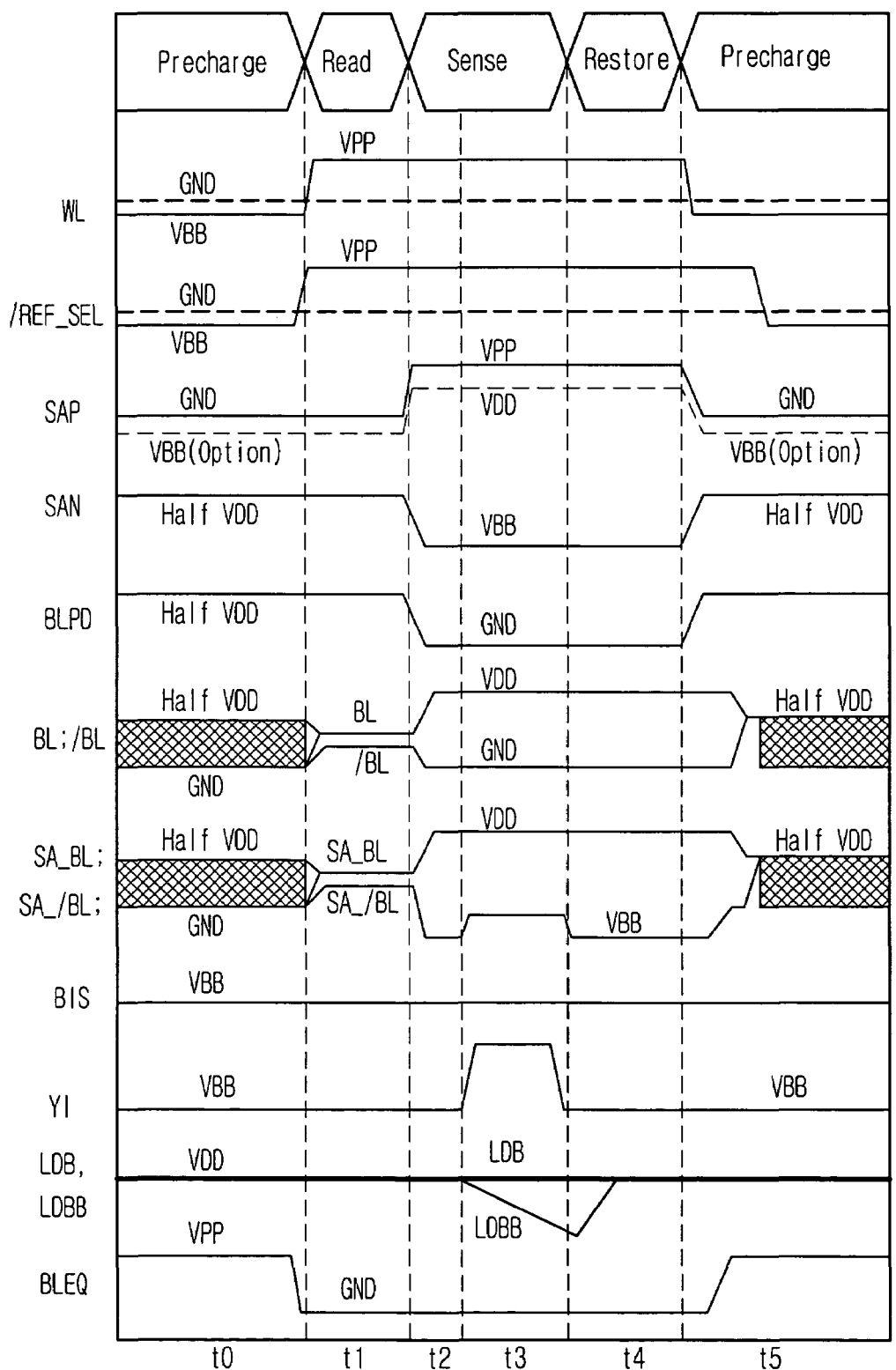
FIG. 11 is a waveform showing a detailed operation of the semiconductor memory device shown in FIG. 7.

FIG. 10 is a waveform showing an operation of the semiconductor memory device shown in FIG. 7. Also, FIG. 11 is a waveform showing a detailed operation of the semiconductor memory device shown in FIG. 7.

Hereinafter, referring to FIGS. 7 to 11, the operation of the semiconductor memory device according to the present invention is described in detail.

In the semiconductor memory device, during a precharge period, any voltage is not supplied to the bit line, e.g., BLn, and the bit line bar, e.g., /BLn. That is, if a precharge command signal BLEQ is activated, each of the bit lines and the bit line bars is floated.

Further, the semiconductor memory device according to the present invention uses the high voltage VPP and the low voltage VBB, not the supply voltage VDD and the ground GND, for amplifying the voltage difference between the bit line BL and the bit line bar /BL. Herein, the high voltage VPP is higher than the supply voltage VDD and the low voltage VBB is lower than the ground GND.

Referring to FIGS. 10 and 11, a read or write operation can be split into four steps: a precharge step, a read step, a sense step and a restore step. Particularly, as shown in FIG. 10, an operation of the reference cell block is described in detail. In the reference cell blocks, each voltage level of nodes RN1 and RN2 is described. Each capacitor of each reference cell block is charged to the half VDD, i.e., ½ supply voltage during the precharge step. Then, during the read step, the sense step and the restore step, i.e., when the precharge command signal BLEQ is inactivated, the reference signal outputted from each reference cell block is outputted in response to an inverse reference selection signal /REF_SEL.

Herein, each voltage level of the nodes RN1 and RN2 can be adjusted based on the reference supply voltage VCP. For example, as shown in FIG. 10, each voltage level of the nodes RN1 and RN2 can be varied in a range from the ground to the half VDD. Herein, the reference supply voltage VCP can be adjusted according to a required voltage level of the reference signal outputted from the reference cell block.

In addition, a voltage level of the reference supply voltage VCP is identical to that of the plate voltage PL in order to supply the reference signal having a half level of the data outputted from the cell array into one of the bit line and the bit line bar.

Namely, for stable operation, a boost-up level caused by the reference signal supplied to one of the bit line and the bit line bar is a half of that caused by the data outputted from the cell array.

For instance, if it is assumed that the supply voltage VDD is about 1.0 V and the boost-up level caused by the data is about 0.2 V, each voltage level of the bit line BL and the bit line bar /BL is kept as about 0.5 V.

Though each voltage level of the bit line BL and the bit line bar /BL is decreased to about 0.3 V as the precharge step is longer after the restore step, if the data is loaded to the bit line BL, the bit line BL becomes about 0.5 V (0.3V+0.2V) and the bit line bar /BL becomes about 0.4 V (0.3V+0.1V) since the boost-up level caused by the reference signal is a half of that caused by the data.

Referring to FIG. 11, hereinafter, it is assumed that a capacitor of a cell included in the first cell array 300*a* coupled to the bit line BL is charged, i.e., stores a logic high data "1".

Particularly, the bit line BL and the bit line bar /BL in the semiconductor memory device according to the present invention are floated in a range from the half supply voltage ½ VDD to the ground GND. Also, referring to FIG. 7, the semiconductor memory device has an open bit line structure.

In a precharge step t0', the bit line BL and the bit line bar /BL are floated. At this time, all word line are inactivated. Namely, if the precharge signal BLEQ activated as the high voltage VPP is kept during the precharge step t0', each voltage level of the bit line BL and the bit line bar /BL is equalized.

In detail, after a restore step t4', i.e., a data is delivered into the local data bus pair and restored in the original cell, the voltage levels of the bit line BL and the bit line bar /BL are slowly decreased because any voltage is not supplied to the bit line BL and the bit line bar /BL during the precharge step t0'. As a result, the voltage level of the bit line BL and the bit line bar /BL is varied within a range from the half supply voltage ½ VDD to the ground GND during the precharge step t0'.

In a read step t1', a read command is inputted and carried out and, then, a word line WL corresponding to an inputted address is activated by the high voltage VPP until a restore step. Herein, for activating the word line, the high voltage VPP is generally used because it is requested that the supply voltage VDD becomes lower and an operating speed of the semiconductor memory device becomes faster.

If the word line WL is activated, a MOS transistor of the cell corresponding to the word line is turned on; and a data stored in a capacitor of the cell included in the first cell array 300*a* is delivered into the bit line BL. At this time, the precharge signal BLEQ inputted to the precharge block 220 is inactivated.

Meanwhile, when the first cell array 300*a* outputs the stored data to the bit line BL, the second reference cell block 400*b* coupled to the bit line bar /BL outputs the reference signal having ½ voltage level of the data stored in the capacitor of the cell to the bit line bar /BL in response to the inverse reference selection signal /REF_SEL.

Otherwise, when the second cell array 300*b* outputs a stored data to the bit line bar /BL, the first reference cell block 400*a* coupled to the bit line BL outputs the reference signal having ½ voltage level of the data stored in the capacitor of the cell included in the second cell array 300*b* into the bit line BL in response to the reference control signal REF_SEL.

Referring to FIG. 11, in the read step t1', it is understood that each voltage level of the bit line BL and the bit line bar /BL is increased by each predetermined voltage level, e.g. about twice voltage level.

Next, in the first and the second sense steps t2 and t3 during the sense step, the first power supply signal SAP is supplied with the high voltage VPP and the second power supply signal SAN is supplied with the low voltage VBB. Herein, the supply voltage VDD can be inputted as the first power supply signal SAP.

In the first sense step t2, the sense amplifier 210 can amplify a voltage difference, i.e., a potential difference, between the bit line BL and the bit line bar /BL by using the first and the second power supply signals SAP and SAN. At this time, a relatively high side between the bit line BL and the bit line bar /BL is amplified to the high voltage VPP; and the other side, i.e., a relatively low side between the bit line BL and the bit line bar /BL, is amplified to the ground GND. Then, the amplified voltage difference is latched in the sense amplifier 210. Particularly, the sense amplifier can amplify a voltage difference faster than the conventional sense amplifier because the high voltage VPP and the low voltage VBB are used instead of the supply voltage VDD and the ground GND.

Herein, a voltage level of the bit line BL is higher than that of the bit line bar /BL. That is, after the bit line BL and the bit line bar /BL are amplified, the bit line BL keeps a voltage level of the high voltage VPP. However, even though the bit bar /BL can be temporary amplified to the low voltage VBB, the bit line bar /BL keeps a voltage level of the ground GND because the second connection block 250*b* is inactivated, i.e., turned off. That is, since the bit line bar /BL is precharged as the ground GND having higher voltage level than the low voltage VBB, the bit line bar /BL in the sense amplifier 210 is not amplified to the low voltage VBB. As a result, a voltage level of the bit line BL in the first cell array 300*a* can be kept as the ground GND.

Herein, the first and the second connection blocks 250*a* and 250*b* are for preventing the low voltage VBB from delivering into the bit line bar /BL in the second cell array 300*b*. As shown in FIG. 11, the bit line and the bit line bar BL and /BL of the cell array is discriminated from the bit line and the bit line bar BL SA_BL and SA_/BL of the sense amplifier 210.

In addition, since a worm capacitance generated by the bit line BL in the second cell array 300*b* is relatively larger, amount of current flowing a transistor included the second connection block 250b is a little. Thus, a voltage level of the bit line bar /BL in the second cell array 300b can kept as the ground GND during the sense step t2 and t3 and the restore step t4.

Likewise, in the case when the bit line BL is amplified to the low voltage VBB, the first connection block 250a is inactivated in order to prevent the low voltage VBB from being delivered into the bit line BL in the first cell array 300a.

If the low voltage VBB is delivered into the bit line BL or the bit line bar /BL in the first or the second cell array 300a or 300b, a data sensed from the first or the second cell array 300a or 300b is destroyed, i.e., a charge loaded in the bit line BL or the bit line bar /BL is discharged. Thus, it is prevented that the low voltage VBB is transmitted to the first or the second cell array 300a or 300b through the first or the second connection block 250a or 250b. As shown in FIG. 11, voltage levels of the bit line and the bit line bar BL and /BL of the cell array are not decreased to the low voltage VBB.

That is, the low voltage VBB is used for increasing an operation speed of the sense amplifier 210 but prohibited from being transmitted to the first and the second cell arrays 300a and 300b.

However, the first and the second connection blocks 250a and 250b cannot totally protect the low voltage VBB from being transmitted into the cell array. Therefore, the semiconductor memory device according to the present invention further includes the sub sense amplifier 230 for amplifying one of the bit line BL and the bit line bar /BL in order to prevent a data destroy based on the low voltage VBB. Even though the low voltage VBB is transmitted to one of the bit line BL and the bit line bar /BL of the cell array, the sub sense amplifier 230 can boost up one of the bit line BL and the bit line bar /BL, which is decreased to the low voltage level, to the ground GND.

In detail, if the data is loaded to the bit line BL, the bit line BL becomes the high voltage level VPP and the bit line bar /BL becomes the ground GND after the sense step. At this time, if the bit line bar /BL is increased to a predetermined voltage above the ground GND or decreased to the low voltage VBB, the sub sense amplifier 230 adjusts the bit line bar /BL to the ground GND because the second NMOS transistor TSB2 is turned on by the voltage level of the bit line BL.

Herein, the bit line voltage control signal BLPD activated as the ground GND is inputted to the sub sense amplifier 230 during the sense step t2' and t3' and the restore step t4'.

During the second sense step t3 after the first sense step t2, the sense amplifier 210 continuously receives the first and the second power supply signals SAP and SAN and, then, a voltage level of the bit line BL is stabilized as the high voltage VPP. Also, an I/O control signal Yi based on an inputted column address is activated as a logic high level. In response to the activated I/O control signal Yi, the data output block 240 delivers each voltage level, i.e., data, loaded at the bit line BL and the bit line bar /BL into the local data line LDB and the local data line bar LDBB.

Herein, the local data line LDB and the local data line bar LDBB are precharged with a ½ core voltage Vcore when any data is not delivered. Then, when the data is delivered into the local data line LDB and the local data line bar LDBB, a voltage level of the local data line bar LDBB is temporary decreased to the ground GND since the voltage level of the bit line bar /BL is the ground GND.

Lastly, in the restore step t4, the data outputted from the capacitor during the read step for boosting up the bit line BL by the predetermined voltage level is restored in the original capacitor. That is, the capacitor is re-charged. After the restore step t4, the word line WL corresponding to the capacitor is inactivated.

After the restore step, the ground GND is supplied to the sense amplifier 210 as the first and the second power supply signals SAP and SAN.

In the conventional semiconductor memory device, since the local data line LDB and the local data line bar LDBB are precharged as the supply voltage VDD or a ½ supply voltage ½ VDD when any data is transmitted through the local data line LDB and the local data line bar LDBB, a voltage level of the bit line bar /BL amplified to the ground GND by the sense amplifier 210 is increased to a predetermined level by the data output block 240.

Thus, for recovering the predetermined level of the bit line bar /BL to the ground GND, the conventional semiconductor memory device has an enough time for the restore step. Otherwise, in the restore step, a fault data can be restored in the original cell of the first or the second cell array 300a or 300b. For example, when an original data is "0", a restore data can become "1". Therefore, in the conventional semiconductor memory device, it takes an enough time, i.e., relatively long time, to perform the restore step t4.

However, the bit line bar /BL in the sense amplifier 210 is amplified to the low voltage VBB having a lower voltage level than the ground GND in the present invention. Thus, because of the low voltage VBB, a voltage level of the bit line bar /BL is little increased if the supply voltage VDD or the half supply voltage, i.e., ½ VDD, is supplied to the bit line bar /BL in the sense amplifier 210.

Therefore, in the semiconductor memory device according to the present invention, a period of the restore step t4 can be reduced.

Then, the semiconductor memory device performs a precharge step t5 again. Also, the precharge signal BLEQ is activated and inputted to the precharge block 220. At this time, the sense amplifier 210 is coupled to the two neighbor cell arrays, i.e., 300a and 300b. As a result, the bit line BL and the bit line bar /BL are floated and the voltage levels of the bit line BL and the bit line bar /BL are equalized. Then, each voltage level of the bit line BL and the bit line bar /BL becomes lower because any voltage is not supplied to the bit line BL and the bit line bar /BL.

Hereinafter, it is assumed that a capacitor of a cell included in the first cell array 300a coupled to the bit line BL is charged, i.e., stores a logic low data "0".

Likewise, in the precharge step to, the bit line BL and the bit line bar /BL are floated as a predetermined voltage level between the ground GND and the half supply voltage ½ VDD.

In the read step t1, a read command is inputted and carried out and then a word line WL corresponding to an inputted address is activated by a supply voltage VDD or a high voltage VPP until the restore step.

If the word line WL is activated, a MOS transistor of the cell corresponding to the word line is turned on; and a data stored in a capacitor of the cell included in the first cell array 300a is delivered into the bit line BL. At this time, the precharge signal BLEQ inputted to the precharge block 220 is inactivated. However, since the data is a logic low level "0", a voltage level of the bit line BL is not changed, i.e., maintained as the ground GND.

Meanwhile, when the first cell array 300a outputs the stored data to the bit line BL, the second reference cell block 400b coupled to the bit line bar /BL outputs the reference signal having ½ voltage level of the data stored in the capacitor of the cell to the bit line bar /BL in response to the inverse reference control signal /REF_SEL.

Next, in the first sense step t2 of the sense step, the first power supply signal SAP is supplied with the high voltage VPP and the second power supply signal SAN is supplied with the low voltage VBB. Then, the sense amplifier 210 can amplify a voltage difference, i.e., a potential difference, between the bit line BL and the bit line bar /BL by using the first and the second power supply signals SAP and SAN, i.e., the high voltage VPP and the low voltage VBB. At this time, a relatively high side between the bit line BL and the bit line bar /BL is amplified to the high voltage VPP; and the other side, i.e., a relatively low side between the bit line BL and the bit line bar /BL, is amplified to the ground GND.

Herein, the first and the second connection blocks are for preventing the low voltage VBB from delivering into the bit line BL in the first cell array 300a. As a result, the bit line BL can keep a voltage level as the ground GND because the first connection block 250a is inactivated, i.e., turned off.

Since other steps for sensing and amplifying a logic low data, i.e., "0", are the same to those of a logic high data, i.e., "1", description of those steps is omitted herein.

Continuously, the write operation of the semiconductor memory device according to the present invention is described. The write operation receives a write command, an address and a data from an external circuit. Then, the data is inputted to the local data line LDB and the local data line bar LDBB. In the sense step, a sensed and amplified data of the sense amplifier 210 is not outputted but the inputted data from an external circuit is latched in the sense amplifier 210. Herein, the sense step also includes the first and the second sense steps t2 and t3 using the high voltage VPP and the low voltage VBB in order to increase an operation speed of the sense amplifier 210. Then, in the second sense step t3, an inputted data is transmitted and latched to the sense amplifier 210 through the data output block 240 in response to the column control signal YI.

Next, in the restore step t4, the data latched in the sense amplifier 210 during the sense step is stored in the capacitor corresponding to the inputted address.

As above described, in the read operation and the write operation, the bit line BL and the bit line bar /BL are precharged as the ground GND and the sense amplifier 210 uses the high voltage VPP and the low voltage VBB for sensing and amplifying a data stored in a cell or latching an inputted data of the local data line and the local data line pair.

As a result, i.e., since the sense amplifier 210 is supplied with the high voltage VPP, the operation speed of the semiconductor memory device according to the present invention is increased, i.e., improved. Also, it can be difficult to boost up a voltage level of the bit line BL or the bit line bar /BL to a predetermined voltage level since the bit line BL and the bit line bar /BL are floated and have a predetermined level below the half supply voltage ½ VDD; however, the sense amplifier 210 can effectively amplify the voltage level by using the high voltage VPP and the low voltage VBB.

Based on a ground level precharge operation as above described, advantages about the semiconductor memory device according to the present invention are expected.

First of all, during the precharge step, there is no power consumption because any voltage is not supplied to the bit line and the bit line bar and the bit line and the bit line bar are floated.

In the conventional semiconductor memory device, during the precharge step, the ground GND and the half supply voltage VDD are continuously supplied to the bit line and the bit line bar. However, in the present invention, the power consumption can be dramatically reduced because any power is not used additionally.

Secondly, in the semiconductor memory device according to the present invention, a bleed current generated between a word line, i.e., a gate of a transistor in each cell, and a bit line is protected. If one of the bit line and the bit line bar has a voltage level above a predetermined level, the bleed current can be occurred. However, since the bit line and the bit line bar is floated and, then, becomes a lower under a predetermined level during the precharge step and the word line is inactivated during the precharge step, any current cannot be flown because there is no voltage difference between one of the bit line and the bit line bar and the inactivated word line. Thus, a power consumption of the semiconductor memory device can be reduced.

Thirdly, in the semiconductor memory device according to the present invention, an operation speed is improved because the sense amplifier is operated by using the high voltage VPP and the low voltage VBB although the voltage level of the supply voltage becomes lower.

Fourthly, the semiconductor memory device according to the present invention can reduce the period of the restore step t4. In the conventional semiconductor memory device, since the local data line LDB and the local data line bar LDBB are precharged as the supply voltage VDD or a ½ supply voltage ½ VDD when any data is transmitted through the the local data line LDB and the local data line bar LDBB, a voltage level of the bit line bar /BL amplified to the ground GND by the sense amplifier 210 is increased to a predetermined level by the supply voltage VDD or the ½ supply voltage ½ VDD. However, the bit line bar /BL in the sense amplifier 210 is amplified to the low voltage VBB having a lower voltage level than the ground GND in the present invention. Thus, because of the low voltage VBB, a voltage level of the bit line bar /BL is little increased if the supply voltage VDD or the half supply voltage, i.e., ½ VDD, is supplied to the bit line bar /BL in the sense amplifier 210.

Figure 12:
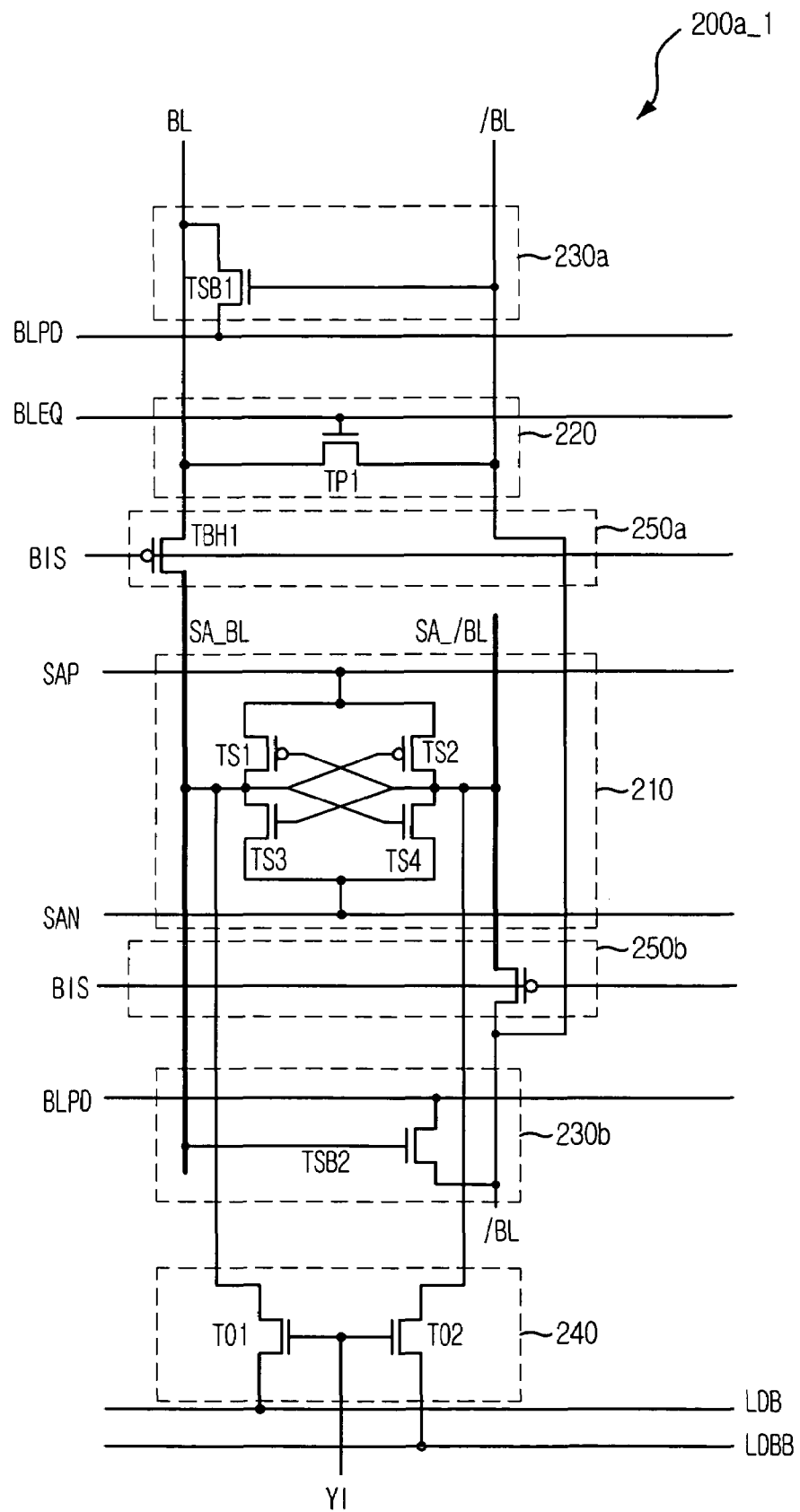
FIG. 12 is a block diagram describing a sense amplifying block shown in FIG. 7 in accordance with another embodiment of the present invention.

FIG. 12 is a block diagram describing a sense amplifying block shown in FIG. 7 in accordance with another embodiment of the present invention.

As shown, the sense amplifying block includes a precharge block 220_1, a first and a second connection blocks 250a_1 and 250b_1, a sense amplifier 210_1, a sub sense amplifier and a data output block 240_1. Herein, the sense amplifying block is similar to the sense amplifying block shown in FIG. 9 in their structures, except for the sub sense amplifier for amplifying one of the bit line BL and the bit line bar /BL to prevent a data destroy based on the low voltage VBB. Thus, a detail description of the sense amplifying block shown in FIG. 7 is omitted herein.

However, the sub sense amplifier includes a first sub sense amplifier 230a_1 and a second sub sense amplifier 230b_1.

In detail, the first sub sense amplifier 230a_1 includes a first NMOS transistor TSB1 having a gate, a drain and a source, the gate coupled to the bit line bar BL, the source for receiving a bit line voltage control signal BLPD and the drain coupled to the bit line BL, and the second sub sense amplifier 230b_1a includes a second NMOS transistor TSB2 having a gate, a drain and a source, the gate coupled to the bit line BL, the source for receiving the bit line voltage control signal BLDP and the drain coupled to the bit line bar /BL.

In the present invention, it is possible to implement a semiconductor memory device for operating in a fast speed under a low power condition, e.g., under 1.5 V, and protects a bleed current from generating to thereby reduce a power consumption.

Also, as compared with the case when the bit line and the bit line bar is precharged as the ½ core voltage, any voltage is not supplied to the bit line and the bit line bar in the semiconductor memory device according to the present invention. As a result, a power consumption during a precharge step can be dramatically reduced.

In the semiconductor memory device according to the present invention, a bleed current is decreased because the bit line and the bit line bar are floated and becomes a lower. Thus, the semiconductor memory device can be reduce a power consumption and a current consumption.

In addition, an operation speed of the sense amplifier becomes faster because the sense amplifier is operated by using the high voltage VPP having a higher voltage level than the core voltage Vcore though the voltage level of the supply voltage becomes lower.

Further, the semiconductor memory device according to the present invention can reduce the period of the restore step. As a result, in the semiconductor memory device according to the present invention, an operation cycle in response to the inputted command, e.g., read or write command, can become shorter. In the conventional semiconductor memory device, since the local data line LDB and the local data line bar LDBB are precharged as the supply voltage VDD or the ½ supply voltage ½ VDD when any data is transmitted through the the local data line LDB and the local data line bar LDBB, a voltage level of the bit line bar /BL amplified to the ground GND by the sense amplifier 210 is increased to a predetermined level by the supply voltage VDD or the ½ supply voltage ½ VDD. However, the bit line bar /BL in the sense amplifier 210 is amplified to the low voltage VBB having a lower voltage level than the ground GND in the present invention. Thus, because of the low voltage VBB, a voltage level of the bit line bar /BL is little increased if the supply voltage VDD or the half supply voltage, i.e., ½ VDD, is supplied to the bit line bar /BL in the sense amplifier 210.

The present application contains subject matter related to Korean patent application No. 2004-87658, filed in the Korean Patent Office on Oct. 30, 2004, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A semiconductor memory device for outputting or storing a data in response to inputted address and command, comprising:
   a first cell array for outputting the data to one of a bit line and a bit line bar;
   a first reference cell block for outputting a reference signal to the other of the bit line and the bit line bar;
   a sense amplifying block for sensing and amplifying a voltage difference between the bit line and the bit line bar; and
   a floating control block for floating the bit line and the bit line bar if a precharge command signal is activated.

2. The semiconductor memory device as recited in claim 1, further comprising:
   a second cell array for outputting a data to one of the bit line and the bit line bar; and
   a second reference cell block for outputting a reference signal to the other of the bit line and the bit line bar, wherein the second reference cell block outputs the reference signal if the second cell array, not the first cell array, outputs the data to one of the bit line and the bit line bar.

3. The semiconductor memory device as recited in claim 2, wherein the floating control block includes:
   a first floating block for floating each bit line and each bit line bar included in the first cell array to thereby equalize each voltage level of the bit lines and the bit line bars; and
   a second floating block for floating each bit line and each bit line bar included in the second cell array to thereby equalize each voltage level of the bit lines and the bit line bars.

4. The semiconductor memory device as recited in claim 3, wherein the sense amplifying block amplifies uses a high voltage having a higher voltage level than a supply voltage in order to amplify the voltage difference between the bit line and the bit line bar.

5. The semiconductor memory device as recited in claim 4, wherein the sense amplifying block uses a low voltage having a lower voltage level than a ground in order to amplify the voltage difference between the bit line and the bit line bar.

6. The semiconductor memory device as recited in claim 5, wherein the sense amplifying block includes:
   a first connection control block for connecting or disconnecting the sense amplifying block to the first cell array;
   a second connection control block for connecting or disconnecting the sense amplifying block to the second cell array;
   a sense amplifier for amplifying the voltage difference between the bit line and the bit line bar; and
   a precharge block for equalizing voltage levels of the bit line and the bit line bar in response to the precharge command signal.

7. The semiconductor memory device as recited in claim 6, wherein the first connection control block includes a MOS transistor for connecting or disconnecting one of the first cell array and the first reference cell block to the sense amplifier.

8. The semiconductor memory device as recited in claim 6, wherein the second connection control block includes a MOS transistor for connecting or disconnecting one of the second cell array and the second reference cell block to the sense amplifier.

9. The semiconductor memory device as recited in claim 6, wherein the sense amplifier includes:
   a first PMOS transistor having a gate, a drain and a source, the gate coupled to the bit line bar, the source for receiving one of the core voltage and the high voltage and the drain coupled to the bit line;
   a second PMOS transistor having a gate, a drain and a source, the gate coupled to the bit line, the source for receiving one of the core voltage and the high voltage and the drain coupled to the bit line bar;
   a first NMOS transistor having a gate, a drain and a source, the gate coupled to the bit line bar, the source for receiving the ground and the drain coupled to the bit line; and
   a second NMOS transistor having a gate, a drain and a source, the gate coupled to the bit line, the source for receiving the ground and the drain coupled to the bit line bar.

10. The semiconductor memory device as recited in claim 6, wherein the sense amplifying block further includes a sub sense amplifying block for amplifying one of the bit line and the bit line bar to the ground.

11. The semiconductor memory device as recited in claim 10, wherein the sub sense amplifying block includes:
- a first NMOS transistor having a gate, a drain and a source, the gate coupled to the bit line bar, the source for receiving a bit line voltage control signal and the drain coupled to the bit line; and
- a second NMOS transistor having a gate, a drain and a source, the gate coupled to the bit line, the source for receiving the bit line voltage control signal and the drain coupled to the bit line bar.

12. The semiconductor memory device as recited in claim 11, wherein the bit line voltage control signal has a ground level if the precharge command signal is activated.

13. The semiconductor memory device as recited in claim 6, wherein the floating control block includes MOS transistors, each for floating one of the bit line and the bit line bar in response to the precharge command signal.

14. The semiconductor memory device as recited in claim 2, wherein the first reference cell block includes:
- a first capacitor for receiving a reference supply voltage to thereby generate the reference signal;
- a first transistor for transmitting the reference signal in response to a reference selection signal; and
- a second transistor for charging the capacitor in response to a reference cell precharge signal.

15. The semiconductor memory device as recited in claim 14, wherein the second reference cell block includes:
- a second capacitor for receiving the reference supply voltage to thereby generate the reference signal;
- a third transistor for transmitting the reference signal in response to an inverse reference selection signal; and
- a fourth transistor for charging the capacitor in response to an inverse reference cell precharge signal.

16. The semiconductor memory device as recited in claim 15, wherein the reference supply voltage is one of the supply voltage, a ½ supply voltage and the ground.

17. The semiconductor memory device as recited in claim 16, wherein the total number of the reference cell blocks is identical to the total number of the bit line and the bit line bar included in the cell arrays.

18. The semiconductor memory device as recited in claim 17, wherein each capacitance of the first and the second capacitors is identical to a capacitance of each unit cell included in the first and the second cell arrays.

19. The semiconductor memory device as recited in claim 1, further comprising a data output means for delivering the data amplified by the sense amplifying means into a data line and a data line bar or delivering an inputted data through the data line and the data line bar into the sense amplifying means.

20. The semiconductor memory device as recited in claim 19, wherein the data output means includes:

- a first MOS transistor coupled between the bit line and the data line for delivering a data loaded in the bit line into the data line; and
- a second MOS transistor coupled between the bit line bar and the data line bar for delivering a data loaded in the bit line bar into the data line bar.

21. The semiconductor memory device as recited in claim 1, wherein any voltage is not supplied to the bit line and the bit line bar if the precharge command signal is activated.

22. A method for performing a read operation and a write operation of a semiconductor memory device based on an inputted address and an inputted command, comprising the steps of:
a) delivering a data stored in a cell array into one of a bit line and a bit line bar;
b) delivering a reference signal generated from a reference cell block into the other of the bit line and the bit line bar;
c) sensing and amplifying a voltage difference between the data and the reference signal by using a low voltage and a high voltage; and
d) floating the bit line and the bit line bar in response to a precharge command signal.

23. The method as recited in claim 22, wherein the low voltage has a lower voltage level than a ground.

24. The method as recited in claim 23, wherein the high voltage has a higher voltage level than a supply voltage.

25. The method as recited in claim 24, wherein the supply voltage and the ground are inputted from outside of the semiconductor memory device.

26. The method as recited in claim 22, further comprising the step of receiving the supply voltage and the ground to thereby generate the low voltage and the high voltage.

27. The method as recited in claim 26, further comprising the steps of outputting the data amplified in one of the bit line and the bit line bar in response to inputted address and command.

28. The method as recited in claim 27, further comprising the steps of amplifying one of the bit line and the bit line bar to the ground in order to prevent the low voltage from delivering into the bit line and the bit line bar respectively coupled to the cell array.

29. The method as recited in claim 22, wherein the d) includes the steps of equalizing each voltage level between the bit line and the bit line bar.

30. The method as recited in claim 22, further comprising the step of delivering the data amplified by the sense amplifying means into a data line and a data line bar or delivering an inputted data through the data line and the data line bar into the sense amplifying means.

31. The method as recited in claim 22, wherein any voltage is not supplied to the bit line and the bit line bar if the precharge command signal is activated.

* * * * *

UNITED STATES PATENT AND TRADEMARK OFFICE
CERTIFICATE OF CORRECTION

| | | |
|---|---|---|
| PATENT NO. | : 7,251,174 B2 | Page 1 of 1 |
| APPLICATION NO. | : 11/038861 | |
| DATED | : July 31, 2007 | |
| INVENTOR(S) | : Kang et al. | |

It is certified that error appears in the above-identified patent and that said Letters Patent is hereby corrected as shown below:

On the title page Item [56], under Foreign Patent Documents, line 6, please delete "200" and insert -- 2000 --.

Signed and Sealed this

Twenty-ninth Day of April, 2008

JON W. DUDAS
*Director of the United States Patent and Trademark Office*